US011201566B2

(12) United States Patent
Krumpholz

(10) Patent No.: US 11,201,566 B2
(45) Date of Patent: Dec. 14, 2021

(54) SWITCH PROTECTION

(71) Applicant: Delta Electronics (Thailand) Public Co., Ltd., Samutprakar (TH)

(72) Inventor: Christian Krumpholz, Freiburg (DE)

(73) Assignee: DELTA ELECTRONICS (THAILAND) PUBLIC CO., LTD., Samutprakarn (TH)

(*) Notice: Subject to any disclaimer, the term of this patent is extended or adjusted under 35 U.S.C. 154(b) by 77 days.

(21) Appl. No.: 16/569,025

(22) Filed: Sep. 12, 2019

(65) Prior Publication Data

US 2020/0091837 A1    Mar. 19, 2020

(30) Foreign Application Priority Data

Sep. 14, 2018 (EP) ..................... 18194594

(51) Int. Cl.
*H02M 7/5387* (2007.01)
*G05F 1/46* (2006.01)
*H02M 1/32* (2007.01)
*H03K 17/10* (2006.01)

(52) U.S. Cl.
CPC ............ *H02M 7/5387* (2013.01); *G05F 1/46* (2013.01); *H02M 1/32* (2013.01); *H03K 17/102* (2013.01)

(58) Field of Classification Search
CPC .. H02M 7/5387; H02M 1/32; H02M 7/53832; H02M 1/088; G05F 1/46; H03K 17/102; Y02B 70/10; G01R 19/16571; G01R 19/16576
See application file for complete search history.

(56) References Cited

U.S. PATENT DOCUMENTS

| 7,826,239 | B2 | 11/2010 | Tepsumran et al. |
| 8,724,280 | B2 | 5/2014 | Andersson et al. |
| 2011/0211376 | A1 | 9/2011 | Hosotani |
| 2013/0099788 | A1* | 4/2013 | Xu ..................... G01R 33/3852 324/322 |
| 2013/0308347 | A1 | 11/2013 | Sato et al. |
| 2013/0314014 | A1 | 11/2013 | Tremel et al. |
| 2015/0049515 | A1* | 2/2015 | Zhao ................. H02M 3/33507 363/17 |
| 2016/0099649 | A1* | 4/2016 | Hara ................... H02M 3/3353 363/17 |
| 2017/0093294 | A1* | 3/2017 | Dai .................... H02M 3/33507 |
| 2018/0054133 | A1* | 2/2018 | Moon ............... H02M 3/33515 |

(Continued)

OTHER PUBLICATIONS

European Search Report dated Mar. 20, 2019, 14 pages.

*Primary Examiner* — Kyle J Moody
(74) *Attorney, Agent, or Firm* — Vector IP Law Group LLC; Robert S. Babayi

(57) ABSTRACT

The bridge circuit comprises input terminals (102.1, 102.2) for connecting a power source (103), a first branch (104) connected between the input terminals (102.1, 102.2). The first branch includes a first and a second section (108.1, 108.2). The first section (108.1) includes a first switch (107.1) and the second section (108.2) includes a second switch (107.2). The method comprises the steps of determining a measured value by measuring a current flowing in or a voltage across one of the two sections (108.1, 108.2), comparing the measured value with a threshold and controlling a switching of the first and the second switch (107.1, 107.2) of the first branch (104) in dependency of a result of said comparison.

20 Claims, 7 Drawing Sheets

(56) References Cited

U.S. PATENT DOCUMENTS

| | | | |
|---|---|---|---|
| 2018/0191252 A1* | 7/2018 | Bianco | H02M 3/3376 |
| 2019/0089171 A1* | 3/2019 | Fischer | H02J 7/025 |
| 2019/0199197 A1* | 6/2019 | Hamada | H02M 3/3376 |
| 2019/0229629 A1* | 7/2019 | Halberstadt | H02M 3/33561 |
| 2019/0334442 A1* | 10/2019 | Iyasu | H02M 3/33515 |
| 2020/0212814 A1* | 7/2020 | Kleinpenning | G01K 7/24 |

* cited by examiner

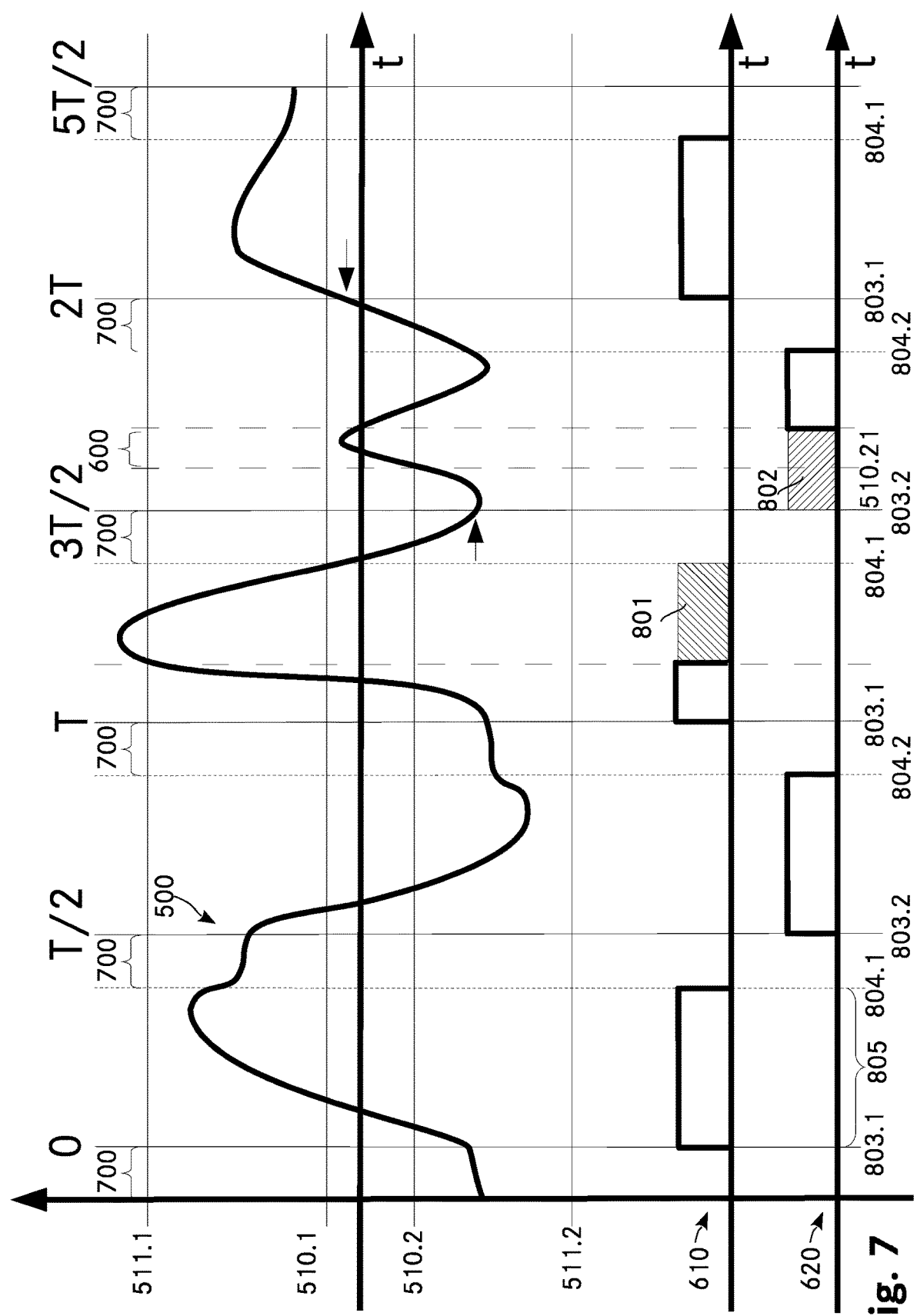

SWITCH PROTECTION

TECHNICAL FIELD

The invention relates to a method for controlling a switch of a bridge circuit, where the bridge circuit comprises a first and a second input terminal for connecting a power source, a first branch connected between the first and the second input terminal and including a first section between the first input terminal and a centre tap forming an output terminal of the bridge circuit and including a second section between the centre tap and the second input terminal, where the first section includes a first switch and the second section includes a second switch. The invention further relates to a controller adapted to carry out such a method, to a switching arrangement comprising such a controller and to a converter comprising such a switching arrangement.

BACKGROUND ART

One of the challenging tasks in the electronic engineering is the increasing of the lifetime of an electrical circuit and its components. The lifetime and the reliability of any device significantly depends on the condition of the electronic circuit integrated in the device. An electronic circuit should not only be able to fulfil its requirement at the moment but has to ensure a proper operation during the whole lifetime of the device. Besides that, in our days the use of integral structures has increased. Single electronic components may hardly be replaced in such integral structures. Therefore, the failure of a single component may paralyze the whole electronic device. Hence, the component's reliability and lifetime becomes even more important.

There exist several failures in a circuit that may harm its electronic components like, for example, too high currents, too high voltage or a short circuit. Means are known in the art to avoid such a failure.

The U.S. Pat. No. 7,826,239 B2 (Delta Electronics), for example, discloses a switching power supply comprising a bridge rectifier with an overload protection delay circuit. The overload protection mechanism is able to protect the switching power supply from damage due to overload problems. For this purpose the overload protection mechanism monitors a feedback signal and compares the feedback signal with a specified threshold value. If the feedback signal exceeds the threshold a stop signal is issued to stop the operation of a pulse-width modulator, and thereby shutting down the switching power supply. In order to avoid a falsely activated overload protection mechanism during load transients when momentary rises occur, the overload protection delay circuit is able to add a time delay to the feedback signal so that the brief rises of the feedback signal are not considered.

The U.S. Pat. No. 8,724,280 B2 (Arne Andersson et al.) discloses another protection by using an e-fuse capable of blocking or interrupting surges, such as lighting surges, which are flowing in the opposite direction to an e-fuse predetermined operational direction. Therefore, the e-fuse comprises a current restrictor capable of blocking currents flowing through the current path in a direction opposite the operational direction. The e-fuse further comprises a controller which is capable of opening a transistor switch and to disconnect the current path when an overcurrent, a short circuit or surge current is detected by a sensor. The controller is further capable of starting a timer when the transistor switch is opened by the controller and it can automatically reclose the opened transistor switch when the delay has elapsed.

Other protection means are disclosed by US 2011/0211376 (Murata Manufacturing). The document discloses a switching control circuit for use in a switching power supply device. When a period in which a voltage at a feedback terminal exceeds a predetermined voltage becomes larger than a predetermined period, an overcurrent detection circuit determines that a current state is in an overload state. In this overload state, the voltage of the determination target signal is increased with an increase in an impedance of a phototransistor. Consequently, in the overload state or in an overvoltage output state the oscillation may be stopped in accordance with the determination target signal.

But not only the above mentioned high currents or high voltages may harm circuits and its electronic components. Also the very fast change of voltage per time unit (dV/dt) or of current per time unit (dI/dt) may lead to a failure of an electronic component. This applies in particular for switches like metal-oxide-semiconductor field-effect transistor (MOSFET). Such high-speed failures are hard to detect, at least it requires sophisticated transient capture equipment. For example, such a failure may occur in connection with half bridge or full bridge structures in a power supply. The well-known bridge circuit usually comprises at least one branch between a first and a second input terminal and a bridge output. The bridge circuit may comprise two MOSFETs as switches in each branch. Usually, the bridge circuit is used to establish two different current paths allowing, for example, to chop a direct current. In this case, the switches of the bridge circuit are usually switched such that in a first current path the current flows at the output of the bridge in a first direction and that in a second current path the current flows at the output of the bridge in an opposite direction in order to convert the direct current into an alternating current.

If the MOSFETs are switched in a conducting state e. g. if a current of a certain height is flowing through the MOSFET, the MOSFET and in particular the body diode of the MOSFET may be overstressed or even damaged because the maximum allowed change of voltage (dV/dt) or change of current (dI/dt) is exceeded. Such a switching of a switch during conducting is also called "hard switching". While switching a switch at an instant of comparable low current or even if no current at all is flowing is called "soft switching".

In particular, resonant converters such as LLC converters operating in a capacitive mode are prone to overstress their switches. A solution of this known problem is to protect the power supply by avoiding operation in the capacitive mode. This can be achieved, for example, by limiting the lower end of the switching frequency to the resonance frequency. Therefore, during start-up of the converter the switching frequency starts at a comparably high level. Subsequently, the switching frequency is continuously reduced until a regulator takes over the switching control. This solution is widely known and well established. Hence, it is easy to implement such a solution. However, the method has serious disadvantages. It is not at any time possible to prevent switching on a conducting body diode of a switch and therefore mitigating or preventing the exceedance of the limit of dV/dt or dI/dt. In particular, at the start-up phase during the first few pulses the switches are likely to be switched when conducting current. The components can therefore not always be switched in a safe operation range. This significantly reduces the lifetime of the switches and therefore of the circuit.

SUMMARY OF THE INVENTION

It is the object of the invention to provide a method for controlling switches pertaining to the technical field initially mentioned, that allows a safe and reliable switching of the switches such that the lifetime of the switches can be increased. Further objects of the invention are to provide a corresponding controller and a corresponding switch controlling arrangement.

The solution of the invention is specified by the features of claim 1. According to the invention the method comprises the steps of a) determining a measured value by measuring a current in the bridge circuit or measuring a voltage in the bridge circuit;
b) carrying out a comparison of the measured value with a threshold and
c) controlling a switching of the first and the second switch of the first branch in dependency of a result of said comparison.

Preferably, the measured value is determined by measuring a current flowing
 a) in one of the two sections,
 b) in the connection line,
 c) into or out of the centre tap or
 d) into or out of one of the input terminals
or by measuring a voltage between any two points in the bridge circuit which are not on the same line, for example
 a) across one of the two sections of the first branch,
 b) across the input terminals,
 c) across one of the switches, or
 d) between the centre tap and a reference voltage.

The measurement can also be done at points having the same current or voltage as the positions mentioned above. For example, the connection line is a line connected to the centre tap different from the lines connecting the centre tap and the first or the second switch. Consequently, its voltage potential is the same as the one of the centre tap and therefore "measuring a voltage between the centre tap and a reference voltage" can be done by connecting a voltmeter to the connection line and to a point having the reference voltage potential. Similarly the current through the centre tap can be measured by measuring the current in the connection line, if there is no current path in parallel to it.

Preferably, the reference voltage is the ground, the voltage at the input terminal, the output terminal or a neutral point. If not otherwise stated a "line" is here and in the following a direct electrical connection between two components. A component can be a power source, a voltage source, a current source, a resistor, an inductance, a capacity, a connection point to other lines, a switch, a transistor or any other device which can influence the current flowing through it or the voltage across it significantly. The restriction to voltage measurements between points not being on the same line should exclude the unreasonable measurements of voltages between two directly connected points which are always on the same potential.

Preferably, determining a measured value is done by measuring a current flowing in one of the two sections or by measuring a voltage across one of the two sections of the first branch.

The method according to the invention allows operating the switches in a safe operation range because the current or the voltage in the bridge circuit is measured before the switches are switched. For example, the method allows reliably switching the switches when the measured value representing a current or a voltage value is equal or falls below a certain threshold. That means, for example, the switches are, apart from unexpected overcurrent situations, only switched when they are not in a conducting state or when they carry only a current which is lower than a given threshold. This increases the lifetime of the switches.

In one example the switching of the switches can be stopped if a current or a voltage exceeds a certain limit. This means, for example, the switches are controlled such that they are not closed when current or voltage in the circuit is too high. In another example the method allows to open the switches in case an overcurrent occurs. By opening the switches the current path can be interrupted and the circuit and its elements are protected from the overcurrent. This can increase the lifetime of the components of the circuit.

If, for example, the value of the threshold is chosen to be close to zero the switches can be switched if the current flowing through the switches is very low or if the current is nearly zero. Hence, the method allows to effectively control the change of the current per time unit (dI/dt) or the change of the voltage per time unit (dV/dt) in the bridge circuit. Therefore, the failure of components of the bridge circuit due to exceeding the limit of the components concerning the dI/dt or dV/dt can reliably be prevented. Furthermore, with the method according to the invention it is not necessary to start up the converter by using a high switching frequency as usual in the art. Instead, the converter may be started up at any frequency. That simplifies the start-up procedure.

Such a controlled switching allows a reliable and safe switching of the switches such that a damage of the switches and a damage of the whole circuit is prevented. Therefore, the lifetime of the circuit may be increased.

As the current flowing in one of the sections is the same as the current flowing through the switch in this section, the current in one of the preferred embodiments is measured in the sections. This is useful to find out how much current is flowing through a switch i.e. whether the current might be dangerous or whether the current or dI/dt is at a level that is preferred for switching the switch.

The current flowing in the connection line is the sum of the currents flowing in the sections according to Kirchhoff's law. However, in the case at hand, the flow through an opened switch will be neglectable and will therefore be assumed, here and in the following, to be zero. Consequently, the current in the connection line equals the current flowing through the closed switch. In one of the preferred embodiments, the current is measured in the connection line. This allows to determine how much current is flowing through the closed switch and therefore to detect i.e. whether the current might be dangerous or whether the current or dI/dt is at a level that is preferred for opening the closed switch and closing the open one. This measurement at a single point can be used for both switches.

The measurement of the current flowing into or out of the centre tap is equal to the current through one of the switches and its sign depends on the decision which direction (in or out) is considered. The absolute value of this measurement will be an upper limit for the current flowing and for the dI/dt through one of the switches and can consequently be used to prevent switching at high currents at high current changing rates or to interrupt undesired high currents. In one of the preferred embodiments the current flowing into or out of the centre tap in measured. This has the advantage of the need of only one measurement device. In addition to a current measurement in the connection line, measuring the currents into or out of the centre tap may also be used to detect if the current though the opened switch is unexpectedly high which may indicate a failure of one of the switches.

In one preferred embodiment the current flowing into or out of one of the input terminals can be measured. This measurement can be used to detect overcurrent and shorts.

In one preferred embodiment the voltage between any two points in the bridge circuit is measured. If the resistance of a component is known, the current inside this component can be calculated from the voltage measured over this component. Therefore the voltage across a section can be used instead of the current through this section and the voltage over one of the switches can be measured to determine the current flowing through this switch. Further, measuring the voltage over a component allows to open or close the switches to protect either the switches themselves or other components from voltages dangerous for the respective component or for determining a suitable point in time for actions like e.g. switching.

In one preferred embodiment the voltage between a point in the circuit, preferably the centre tap, and a reference voltage or the voltage between the input terminals is measured. A voltage measurement between a point in the circuit and a reference voltage like a ground or a neutral point and also a voltage measurement across the input terminals, can be used to detect periodicities in the voltage and to avoid for example to switch the switch close to periodically occurring voltage peaks or voltage minima.

The term bridge circuit comprises a first and a second input terminal and at least one branch connected between the first and the second input terminal. The branch includes at least two switches and a centre tap between the two switches wherein the centre tap forms an output terminal of the bridge circuit. The bridge circuit may comprise further components for example measuring devices, additional switches, diodes, coils, capacitors and the like. Preferably, the first and the second input terminal of the bridge circuit are connected to a power source, preferably to a voltage source. Furthermore, the bridge circuit may be connected to another circuit by the output terminal of the bridge circuit. Thus, the bridge circuit is a part of a current path. The term current path is understood as being a closed path e. g. an electric circuit in which current may flow.

The term bridge comprises a full bridge or a half bridge as well known in the art. The full bridge includes usually at least two branches each branch comprising at least two switches, wherein each branch comprises a centre tap between the two switches. The two centre taps preferably form each an output terminal of the bridge circuit. The bridge branch may comprise further components such as switches, measuring devices, diodes, coils, capacitors and the like. The half bridge usually comprises at least one branch with two switches with a centre tap between the two switches. The full bridge and the half bridge may comprise further branches connected between the first and the second input terminal. These further branches may comprise other components such as switches, measuring devices, diodes, coils, capacitors and the like.

The power source comprises any source that is adapted to generate electrical power. Preferably, the power source is a direct current power source such as a battery, a renewable power source such as a photovoltaic system, a wind farm or a hydroelectric power station or any other direct current electric power system. The power source is preferably a voltage source.

The measuring of a current, preferably the current flowing in one of the two sections, may comprise measuring a positive as well as a negative current. That means the measuring comprises the measuring of a current flowing from outside of the first branch (for example from a possibly present second branch) through the centre tap into the first branch of the bridge circuit. In this case the measured value has a negative sign. In contrast to that, a measured current flowing at the centre tap out of the bridge circuit to another circuit or to a centre tap of a possibly present second branch has a positive sign. However, the assignment of the signs may also be vice versa. In other words, not only the absolute value of the current is measured but also its flow direction.

The measuring of a current, preferably the current flowing in one of the two sections may comprise measuring the absolute value of the current.

The current can be measured indirectly by measuring the voltage over a known resistance. Also a voltage can be measured as an absolute value or comprising a sign indicating on which side connected to the measurement device has the higher potential.

In an embodiment, where the bridge circuit comprises a first and a second branch, e. g. in a full bridge circuit, the current can also be measured in one of the two sections or at the centre tap of the second branch. Accordingly, the voltage can also be measured across a section between the first input terminal and the centre tap of the second branch or across the section between the centre tap of the second branch and the second input terminal.

Carrying out a comparison means to compare whether the measured value lies above, falls below or is equal to the threshold. According to the result of the comparison the switches of the first and the second switch are opened or closed. This allows setting specific conditions for switching the switches. Preferably, the first switch and the second switch may be switched at the same time. Equally, one switch may be switched after the other switch has been switched. Preferably, the mentioned comparison is carried out each time before each switching of the switches of the bridge circuit.

Usually the switches of a bridge circuit are switched by means of a pulse-width modulation (PWM) signal as it is well known in the art. Such PWM signals usually comprise pulses of different pulses widths while the frequency remains constant. However, the frequency may vary in exceptional cases such as start-up procedures or shut down procedures. The signal for switching the switches comprises pulses of a certain width, wherein the switches remain close or remain open in dependency of the width of the pulses. In contrast to such a state of the art solution the method according to the invention additionally modulates the pulse width in dependency of a result of the comparison of the measured value with the threshold.

The switches of a bridge circuit can also be switched by means of a frequency modulated (FM) signal. In this case, the switches remain closed or remain open in dependency of the frequency of the signal. For example, the duty cycle of the FM signal is kept constant but the width of the pulses and therefore their number per time unit can change and indicates, if the desired state of the switch (opened or closed). A high frequency of pulses respectively a small pulse width and may cause the switch to open while a low frequency of pulses respectively a large pulse width may cause the switch to close or vice versa.

The term switch comprises any type of switch that is switchable by an electrical signal and that is able to establish an electrical connection or is able to interrupt an electrical connection. The term switch comprises switches such as transistors, a logic gate, a semiconductor switch, a piezo switch, a coil switch or a hall-effect switch. The switch can be implemented as an independent electronic device or as a semiconductor device mounted on a printed circuit board. Preferably, the first and the second switch are transistors.

The switching of the switches comprises the opening and closing of the switches. In the present description the term open means that the electrical connection in the switch is interrupted such that no current or nearly no current may flow through the switch. In contrast to that the term close means the electrical connection in the switch is established such that current may flow through the switch.

Preferably the first and the second switch are switched such that a first and a second current path are formed, wherein the first current path differs from the second current path. Preferably, the switches are switched in a sequential order and in a repetitive manner such that the first current path is established and subsequently interrupted and after a dead time the second current path is established and subsequently interrupted in order to establish again the first current path after a dead time. This allows an efficient switching of the switches and an efficient operation of the bridge circuit.

Preferably, the comparison includes the step of detecting, when an absolute value of the measured value crosses the threshold. An absolute value of the measured value is a non-negative value of the measured value without regard to its sign. The term "cross the threshold" means that the absolute value is first below the threshold and increases above the threshold (crossing in the positive direction) or it means that the absolute value is first above the threshold and falls below the threshold (crossing in the negative direction). Such a comparison allows switching the first or the second switch if the measured value exceeds or falls below the threshold or is equal to the threshold. For example, the switches can exactly be switched if the measured value crosses a threshold.

In one embodiment, the comparison is carried out with the measured value. That means the sign of the measured value is considered in the comparison. This allows to distinguish between positive and negative measured values in the comparison and increases therefore the flexibility of the method.

Furthermore, in another embodiment the comparison comprises the step of detecting, when the measured value lies within a range above or below the threshold instead of detecting when the measured value crosses the threshold.

In one embodiment, the measured value can be positive or negative. In this case, the comparison can be done with a positive and a negative threshold. Two thresholds, having the same absolute value but different signs, are called a "threshold pair" in the following. The two thresholds are the members of such a threshold pair. At least one of the switches is closed while the measured value is greater than or equal to the negative threshold and smaller than or equal to the positive threshold. Or in other words: At least one of the switches is closed while the measures value lies inside the threshold interval defined by the threshold pair. The threshold interval is the interval limited by the two members of the threshold pair or by two thresholds not forming a pair.

This embodiment allows to set different thresholds for negative and positive measurement values and increases thereby the flexibility of the method. Such a controlling allows a safe switching of the switches. That means the switches are not switched if the current flowing through the switch exceeds any of the thresholds or if the voltage across one of the two sections of the first branch exceeds any of the thresholds. Therefore, the limit of the switches concerning the change of current per time unit or the change of voltage per time unit can be maintained. This prevents a damage of the components and therefore increases the life time of the switches.

In one embodiment, the measured value can be positive or negative. In this case, the comparison can be done with a positive and a negative threshold. At least one of the switches is closed while the measured value is smaller than the negative threshold or greater than the positive threshold.

In this case, for example, the current path may be interrupted if the current flowing in the circuit is too high.

Preferably, one of the switches in a branch is opened when the measured value rises above the negative threshold or falls below the positive threshold and another one of the switches in the same branch is closed when the measured value is between the negative and the positive threshold.

Such a switching ensures that at no instant both switches are closed at the same time and therefore produce a short circuit. Furthermore, since the switch is only closed if the absolute value of the measured value is equal or falls below the threshold, this prevents the switches of being switched when current is flowing through the switch, e. g. a so called hard switching is mitigated. This prevents damage in the switches and increases the life time of the switches.

In another embodiment all switches may be opened if the absolute value of the measured value is higher than the positive threshold or lower than the negative threshold. The opening of all switches may be useful in order to prevent the components of damage if a very high current or a very high voltage occurs in the bridge circuit.

In one preferred embodiment, there are predetermined preliminary closing and opening times of the first and the second switches. The threshold is in this embodiment a first threshold with a positive sign. In addition, there is a second threshold with a negative sign. The step of carrying out a comparison of the measured value with the threshold comprises the step of determining, at a preliminary closing time of the first switch, if the measured value is equal or smaller than the first threshold and determining at a preliminary closing time of the second switch if the measured value is equal or greater than the second threshold.

The step of controlling a switching of the first and the second switch of the first branch in dependency of a result of said comparison comprises in this embodiment the following steps:

If the result of the comparison is positive and if it was done at the preliminary closing time of the first switch, the first switch is closed immediately and if the comparison was done at the preliminary closing time of the second switch, the second switch is closed immediately.

If the result of the comparison is negative and if it was done at the preliminary closing time of the first switch, the first switch is closed at or after the time of a subsequent negative crossing of the first threshold by the measured value.

However, such a closing occurs only, if the subsequent negative crossing of the first threshold occurs after the preliminary closing time at which the comparison was done and if the expected time of closing the first switch falls in a time frame between the preliminary closing time at which the comparison was done and the following preliminary opening time of the first switch.

If the result of the comparison is negative and if it was done at the preliminary closing time of the second switch, the second switch is closed at or after the time of a subsequent positive crossing of the second threshold by the measured value.

However, such a closing occurs only, if the subsequent positive crossing of the second threshold occurs after the preliminary closing time at which the comparison was done and if the expected time of closing the second switch falls in a time frame between the preliminary closing time at which the comparison was done and the following preliminary opening time of the second switch.

The result of the comparison done at the preliminary closing time of the first switch is positive, if the measured value is equal or smaller than the first threshold.

The result of the comparison done at the preliminary closing time of the second switch is positive, if the measured value is equal or greater than the second threshold.

The result of the comparison is negative, if it is not positive.

In one embodiment, there are predetermined preliminary closing and opening times of the first and the second switches. The step of carrying out a comparison of the measured value with the threshold comprises the step of determining at every preliminary closing time if the measured value indicates a direction suitable for the switch associated with the preliminary closing time and, if this is not the case, determining if the absolute value of the measured value is equal or lower than the threshold. The step of controlling a switching of the first and the second switch of the first branch in dependency of a result of said comparison comprises the following steps: If the result of the comparison is positive, then the switch associated with the preliminary closing time at which the comparison was done is closed. If the result of the comparison is negative, the switch associated with the preliminary closing time at which the comparison was done is closed at or after the time of a subsequent crossing of the threshold by the absolute value of the measured value. However, this closing happens only if such a crossing occurs after the preliminary closing at which the comparison was done and if the expected time of closing falls in a time frame between the preliminary closing time at which the comparison was done and the following preliminary opening time of the switch associated with the preliminary closing time The switch associated with the preliminary closing time is the first switch, if the preliminary closing time is the preliminary closing time of the first switch and analogously for the second switch. A direction is suitable for a switch if for example a current is running in a direction which allows a soft switching of the switch or if a voltage is directed such that a safe switching is possible. For example, a current in blocking direction of a unidirectional switch allows a safe switching of this switch is many cases. The direction is typically indicated by the sign of the measured value.

The idea of these embodiments is the following:

At each predetermined preliminary closing time of a switch, the sign of the measured values is compared to the switch about to be closed: If it is time to close the first switch, the measured value should be negative. If it is time to close the second switch, the measured value should be positive. If this is the case, there is a nominal situation and the respective switch is closed.

If, however, the sign of the measured value is not as it is supposed to be, the absolute value of the measured value becomes important: If the measured value is only slightly wrong, this is if it has only a small absolute value in the undesired direction, switching is still safe and the respective switch is closed at the predetermined preliminary closing time. The first and the second threshold, in the one embodiment, or the threshold, in the other embodiment, determine what is considered to be a small absolute value in this case.

There are however cases, where the absolute value of the measured value is greater than considered safe. In these cases, closing the switch reduces the lifetime of the switches and increases power losses and should be avoided accordingly. Therefore, closing of the switch is postponed until the absolute value of the measured value has dropped down to a safe level. In addition, it is in many cases preferred to postpone the closing even further by a delay in order to close the switch at even more desirable conditions.

In addition, the closing of the switch should happen inside a given time interval beginning with the preliminary closing time and ending with the subsequent preliminary opening time. The preliminary closing and opening times of the first and second switch are arranged in such a way that these time intervals do not overlap. This ensures that there is no time at which both switches are closed.

The combination of the requirements "closing during the specified time interval" and "small absolute value of the measured value" may lead to the situation that a switch stays open during the full time interval between its preliminary closing time and its subsequent preliminary opening time. However in most cases, these embodiments lead, if critical situation occur, to a leading edge modulation of the switching signal indicating the closure of a switch.

The method according to the two embodiments is essentially repeated over and over again, beginning always at the preliminary closing times, whereby the first and the second switch swap their roles as well as the suitable direction or the threshold used in the comparison step.

These two embodiments have the advantage that the testing eliminates exactly the situations of potential danger to the switches without any requirements on the environment of the bridge circuit as there are little predictions used on how the measured value evolves with time and the need for such predictions can be reduced even further when using a delay of zero.

According to one embodiment the bridge circuit comprises a first body diode connected in parallel to the first switch and a second body diode connected in parallel to the second switch. The first and the second switches are unidirectional switches. The body diodes are arranged such that their conducting direction is opposite to the conducting direction of the unidirectional switch they are connected to in parallel.

Arranging body diodes in parallel to unidirectional switches but with opposite conducting direction has the advantage that voltages appearing on the output side of the bridge can be reduced during times when all switches are opened. Consequently, the circuitry can return in a known and predictable state from time to time.

In one embodiment, in addition to the body diodes, there are capacitors arranged in parallel to the unidirectional switches.

In one embodiment, the preliminary closing times of the first switch have a time difference T from each other and the preliminary closing times of the second switch have a time difference T from each other and a time difference T/2 from the preliminary closing times of the first switch. T is the reciprocal of a desired output frequency of the bridge circuit. A preliminary closure duration is less than T/2. The preliminary opening times of the first or the second switch occur the preliminary closure duration after the preliminary closing times of the respective switch. The difference between T/2 and the preliminary closure duration defines a dead time. The dead time is preferably chosen in such a way that the voltages over all sections of the bridge circuits have essentially disappeared at the following preliminary closing time under nominal working conditions.

Bridge circuits with switches are typically used in power converters and the switching frequency determines the output of the converter. Under nominal conditions, a periodic switching is desired and such a periodic switching with a given frequency is what can be realized by the controlling the first and the second switch with closing signals appearing at the respective preliminary closing times and opening signal appearing at the respective preliminary opening times.

Providing a dead time during which all switches are opened avoids on the one hand that accidently all switches are closed at the same time and on the other hand it allows a discharge of capacitances arranged in parallel with the switches which helps to protect the switches, too.

In one embodiment, the measured value is the current, preferably the current in the connection line. The sign of the current is chosen such that the first body diode is in reverse direction with respect to a positive current.

Measuring the current and therefore the properties, which is important for soft switching, minimizes the assumptions needed to apply the method according to the invention. Further, current measurements can be done precisely. If the sign of the current is chosen such that the first body diode is in reverse direction, then the first switch conducts this current if it is closed. Also the body diode of the second switch conducts when a positive current is measured in this embodiment. As the body diode of the second switch is conducting in this condition, the second switch can be closed without any risk.

Preferably, controlling the switching of the first and second switch comprises a closing of the first or the second switch if the absolute value of the measured value is equal or falls below the threshold.

Such a controlling allows a safe switching of the switches. That means the switches are not switched if the absolute value of the current flowing through the switch exceeds the threshold or if the absolute value of the voltage across one of the two sections of the first branch exceeds the threshold. Therefore, the limit of the switches concerning the change of current per time unit or the change of voltage per time unit can be maintained. This prevents a damage of the components and therefore increases the life time of the switches.

There can be situations where the measured value is equal or below the threshold but closing one of the switches is not desired. Such a situation may occur during the dead time, where all switches remain open by purpose or if one switch is already closed while the measured value crosses the threshold.

In order to achieve the above mentioned switching the pulse width of one or more pulses of the PWM signal or the frequency of the FM signal for switching the switches may be adjusted. For example, the pulse width of the pulses of the PWM signal may be extended or shortened or the frequency of the FM signal may be increased or decreased. Preferably, the pulse width of one pulse of the PWM signal is shortened. The extended or shortened pulse of the PWM signal allows to push up or to delay the closing or opening of a switch. Preferably, the frequency of the FM signal is increased. The increased frequency of the FM signal allows to push up or delay the closing or opening of a switch.

In one embodiment, the switches are closed if the absolute value of the measured value exceeds the threshold. In this case, for example, the current path may be interrupted if the current flowing in the circuit is too high.

In a preferred embodiment of the present invention the method includes the steps of opening one of the switches and further comprises the step of closing the other of the switches if the absolute value of the measured value is equal or falls below the threshold.

Such a switching ensures that at no instant both switches are closed at the same time and therefore produce a short circuit. Furthermore, since the switch is only closed if the absolute value of the measured value is equal or falls below the threshold prevents the switches of being switched when current is flowing through the switch, e. g. a so called hard switching is mitigated. This prevents damage in the switches and increases the life time of the switches.

Preferably, closing the first switch and opening the second switch establishes a first current path and opening the first switch and closing the second switch establishes a second current path. The steps of opening one switch and closing of another switch do not have to immediately follow each other. Instead, there may be a dead time between the switching of one switch and the switching of the other switch. The dead time ensures that the two switches in one branch are not closed at the same time and therefore provoke a short current.

In one embodiment, one of the switches is opened if the absolute value of the measured value is equal or falls below the threshold. Such a switching may be useful to stop switching if the current or voltage in the circuit is too low for a proper operation.

In another embodiment the switches may be opened if the absolute value exceeds the threshold. The opening of both switches may be useful in order to prevent the components of damage if a very high current or a very high voltage occurs in the bridge circuit.

Preferably, controlling the switching of the first and the second switch in dependency of a result of the comparison includes waiting a delay after a threshold crossing in the case of a comparison which is negative before closing the first or the second switch if the duration between the threshold crossing and the preliminary opening time of the switch is greater than the delay.

Preferably, the threshold crossing is the crossing of the first or the second threshold.

The comparison is negative, if it resulted in keeping a switch opened before the threshold crossing at hand, although this switch would have been closed before the threshold crossing at hand in case of a different outcome of the comparison.

Said delay is a time period. Preferably, the delay lasts between 1 and 10% of the period duration of the frequency of the PWM switching signal. Preferably the frequency is at least 1 kHz, preferably between 50 and 500 kHz and the delay lasts at least hundred nanoseconds, preferably between 100 and 500 nanoseconds. Preferably, also a FM signal can be used. If a FM signal is used, the delay lasts preferably at least hundred nanoseconds, more preferably between 100 and 500 nanoseconds. The delay does not correspond to the dead time, which is usually set between the switching of one switch and the subsequently switching of another switch.

The delay allows switching the switches not only at the instant when a threshold crossing is detected but allows a switching at a later time, i.e. a given delay after the crossing of the threshold has been detected. Therefore, the reaction to crossing at least one threshold may be shifted. In other words the threshold may be set at any value, for example at a value that is easy to measure. Due to the delay the switching of the first or the second switch may be delayed such that the switching of the switches is carried out at a desired instant.

Preferably, the delay is a constant time period. In one embodiment the delay time may be computed in each cycle of the PWM signal. Preferably the cycle of the PWM signal is the reciprocal of the frequency of the PWM signal. Preferably, in the case of a FM signal, the delay time is computed in regular time steps, e.g. every 0.5 milliseconds.

In another embodiment, the controlling of the switching of the switches does not include a delay. In this case the switches are immediately switched after the crossing of the threshold is detected.

In an even more preferred embodiment of the invention, the delay is computed in dependency of a gradient of the curve representing the current flowing at the centre tap out of the bridge circuit or representing the voltage across one of the two sections of the first branch.

Preferably, the gradient is measured in a region where the measured signal crosses the threshold. The measured current flowing in one of the two sections or the voltage across one of the two sections usually forms a curve in the form of a sine wave. Preferably, the gradient of said sine wave is computed in the region of the threshold. This means the gradient is calculated in the second half of a sine half wave, when the absolute values of the measured value falls towards the threshold crossing.

The computed gradient allows an approximation of the current curve or of the voltage curve or of both. Hence, the value of the measured current or voltage at a specific time can be forecasted. Therefore, the delay can exactly be set in accordance with the threshold, for example to switch the switches at a desired instant. The delay may be realized by a delay element able to delay a command signal. Such delay elements like timers or lag elements are well known in the art.

In one embodiment, the delay may be calculated independent of the gradient of the current curve. In this case the delay may be set based on an experience value.

In a preferred embodiment of the invention, the delay is computed such that a closing of the first or the second switch is carried out when the absolute value basically equals zero. That means the absolute value of the measured value lies within a range around zero. Preferably, the absolute value when the switching is carried out is in a range of −1 ampere to +1 ampere, preferably in a range of −0.5 ampere to +0.5 ampere.

Such a switching of the first or the second switch ensures that a high rate of change of current per time unit (dI/dt) or of change of voltage per time unit (dV/dt) can be avoided in the circuit. This avoids a damage of the components of the bridge circuit. In particular, it may prevent a damage of the body diodes of the switches in the bridge circuit.

In one embodiment, the delay is computed such that the closing of the switches is carried out when the absolute value is slightly above or below zero. This means, for example, the closing is carried out if the absolute value lies in a range of 1% to 5% of an amplitude of the measured value.

Preferably, the measured value is a current and the threshold is a current value between 0 and 10 amperes, preferably between 0 and 5 amperes. In one embodiment, the threshold is a current value between 0.5 and 1 ampere. Preferably the absolute value of the first and the second threshold are the same and between 0 and 10 amperes, preferably between 0 and 5 ampere and especially between 0.5 and 1 ampere.

A current value in such a range can easily and reliably be measured with a current measuring unit know in the art as listed below. That means the determining of the measuring value does not require a special and costly measuring system. Due to the delay time the switching of the switches is carried out when the current flowing through the switch basically equals zero.

In one embodiment, the threshold may comprise a value above 10 ampere. In another embodiment the threshold may be a voltage value. In this case the measured value has to be a voltage measured by a voltage measuring unit as listed below.

Preferably, controlling the switching of the first and second switch comprises an opening of the first or the second switch if the absolute value of the measured value is equal or exceeds the threshold, preferably if the absolute value of the measured value is equal or exceeds a third threshold which is greater than the first threshold.

Such a switching is advantageous in order to prevent the circuit from an overcurrent or an overvoltage. In other words, such a controlling is an overcurrent or an overvoltage protection. Preferably, if the current or the voltage in the circuit exceeds a predetermined threshold the first switch and the second switch are opened in order to interrupt the current path and therefore preventing the components of the bridge circuit from the high current or/and the high voltage in the circuit. This increases the lifetime of the components of the circuit.

Preferably, the threshold is set at a value between 20 and 40 amperes. Advantageously, the first and the second switch are held open as long as the overcurrent or/and the overvoltage are present in the circuit. This protects the components of the circuit.

Preferably, the step of carrying out a comparison comprises the comparison of the absolute value with a first threshold set at a low value, preferably around one ampere as described further above, and a comparison of the absolute value with a third threshold set at a high value, preferably at a value between 20 and 40 ampere. This further increases the safety, since the switches can be switched in a safe operation range.

In one embodiment, the first and the second switch are opened if the absolute value of the measured value is equal or is below the threshold. This is advantageous if a minimum current or voltage has to be present in the circuit for a proper operation.

In a preferred embodiment of the present invention the bridge circuit comprises a second branch connected between the first and the second input terminal and including a first section between the first input terminal and a centre tap and including a second section between the centre tap and the second input terminal, where the first section includes a third switch and the second section includes a fourth switch. Preferably, the method comprises the steps of a) determining the measured value by measuring the current in the bridge circuit or by measuring a voltage in the bridge circuit, b) carrying out a comparison of the measured value with a threshold and c) controlling a switching of the four switches of the two branches in dependency of a result of said comparison.

Preferably, the measured value is determined by measuring a current flowing a) in one of the four sections,
   b) in one of the connection lines,
   c) into or out of one of the centre taps, or
   d) into or out of one of the input terminals
   or by measuring a voltage between any two points in the bridge circuit, for example a) across one of the four sections of the two branches,
b) across the input terminals
c) across the centre taps
d) across one of the switches or
e) between one of the centre taps and a reference voltage.

With regard to the possible points in the bridge circuit for measuring the voltage and the reference voltage, the features and remarks mentioned above apply preferably as well in this context.

Preferably, determining a measured value is done by measuring a current flowing in one of the four sections or by measuring a voltage across one of the four sections of the two branches.

Such a bridge circuit is called a full bridge circuit. The full bridge circuit allows an even more safe operation of the switching because the full bridge comprises four switches. Therefore, each of the two current paths that can be established in the full bridge circuit may comprise two switches. In order to establish one of the two current paths two switches have to be closed. On the other hand if one current path has to be interrupted only one switch has to be opened. This allows a safe operation.

In one embodiment, the bridge circuit comprises only one branch, e.g. the circuit is a half bridge. A half bridge has usually only one switch per current path and has therefore less components.

Preferably, the first switch of the first branch and the fourth switch of the second branch are switched at the same time and the second switch of the first branch and the third switch of the second branch are switched at the same time. This allows establishing two different current paths in the full bridge and allows a safe switching of the four switches of the full bridge circuit.

In one embodiment, all switches are opened and then in a first step the first switch is closed and in a second step the fourth switch is closed. Analogously, the opening of these two switches may be carried out stepwise. The closing and opening of the second and the third switch may be switched in analogous manner. This allows an even safer operation.

Furthermore, the solution of the present invention is specified by a controller for controlling a switch of a bridge circuit, where the bridge circuit comprises a first and a second input terminal for connecting a power source, a first branch connected between the first and the second input terminal and including a first section between the first input terminal and a centre tap and including a second section between the centre tap and the second input terminal. The first section includes a first switch and the second section includes a second switch. According to the invention the controller comprises
a) an input for receiving a measured value of a current in the bridge circuit or of a voltage in the bridge circuit provided by a measuring unit;
b) a comparison unit for comparing the measured value with a threshold and
c) drive means for controlling a switching of the first and the second switch of the first branch in dependency of a result of said comparison.

The comparison unit and the drive means are adapted to execute the steps of the method according to the invention.

Preferably, the input is for receiving a measured value of a current or a voltage as specified above, wherein the measured value is provided by a measuring unit.

Preferably, the comparison unit is adapted for comparing the measured value with a first and a third threshold.

Preferably, the comparison unit is adapted for comparing the measured value with a first, a second, a third and a fourth threshold.

With regard to the possible points in the bridge circuit for measuring the voltage and the reference voltage, the features and remarks mentioned above apply preferably as well in this context.

Preferably, the input is for receiving a measured value of a current flowing in one of the two sections or of a voltage across one of the two sections of the first branch provided by a measuring unit.

The controller may be an electronic component for example a microprocessor or a field-programmable gate array (FPGA), a logical unit or the like. In one embodiment, the controller does not comprise any hardware but is implemented as software running on an existing or designated processor. That means the above mentioned steps of comparing and the controlling are implemented in the software. This allows a very compact implementation of the controller. In another embodiment some of the steps according to the invention are implemented in a physical unit (hardware) and some of the steps of the controller are implemented in a software.

The invention is further specified by a switch control arrangement for a converter. The bridge circuit comprises a first and a second input terminal for connecting a power source, a first branch connected between the first and the second input terminal and including a first section between the first input terminal and a centre tap and including a second section between the centre tap and the second input terminal, where the first section includes a first switch and the second section includes a second switch.

The switch control arrangement comprises a measuring unit for measuring a current or a voltage in the bridge circuit and the switch control arrangement further comprises a controller as described above.

Preferably, the measuring unit is for measuring a current or a voltage as specified above.

With regard to the possible points in the bridge circuit for measurement the voltage and the reference voltage the features and remarks mentioned above apply preferably as well in this context.

Preferably, the measuring unit is for measuring a current flowing in one of the two sections or for measuring a voltage across one of the two sections of the first branch.

The measuring unit preferably comprises a current measuring device as it is known in the art. The current measuring device may be an analogue or a digital current measuring device. There are several current measuring methods known in the art. For example, the current measuring device may be a current measuring circuit with shunt resistors, an arsonval-galvanometer, a measuring transducer, a measuring transformer, a moving-coil instrument, an ampere meter, a multimeter able to measure more than one electrical value or any other device or circuit adapted to measure an electrical current. In case of an analogue current measuring device the measured value has to be digitalized in order to be able to be processed by the controller.

In one embodiment, the measuring unit may comprise a voltage measuring device such as voltage measuring circuit, a voltmeter as known in the art or any other device adapted to measure a voltage. The voltmeter may be an analogue or digital voltmeter. Furthermore, the measuring unit may comprise a current measuring device as well as a voltage measuring device.

Furthermore, the invention is specified by a converter comprising a bridge circuit and a switch control arrangement as described above.

In the present description the term converter comprises converters converting AC current to DC current as well as inverters converting DC current to AC current. The converter may be of any type of converter such as a single-phase converter, a three-phase converter or a multilevel converter. Preferably, the converter is a LLC converter, any type of resonant converter or any type of forward converter. The converter may be realised as half bridge converter or as full bridge converter. Furthermore, the converter may be, for example, realised as LCC converter having two reactive elements, one inductor and two capacitors. In one embodiment the converter may be realised as LLC converter having two inductors and one capacitor. Preferably, the converter is realised as LLC converter. Preferably, the converter is a DC/AC converter converting a direct current to an alternating current.

Preferably, the switches of the bridge circuit of the converter are metal-oxide-semiconductor field-effect transistors (MOSFET). MOSFETs are efficient switches that can be used for fast switching applications. Furthermore, MOSFETs are energy efficient switches with a relative low heat generation compared to other switches such as bipolar transistors (BJT).

In one embodiment, other transistors or other electronic switches may be used for the bridge circuit.

In one embodiment, the measured value is a rectified value and there are two thresholds: A first and a third threshold whereby the first threshold is lower than the third threshold. The switches are controlled such that a switching happens after a delay after a negative crossing of the first threshold. The switches are further controlled to open, such that the current is interrupted, immediately after a positive crossing of the third threshold. Preferably, the switches are controlled such that some of them are closed after a negative crossing of the third threshold. In another embodiment, the switches stay open after a negative crossing of the third threshold and some of the switches close after a delay after the next negative crossing of the first threshold.

In another embodiment, the measured value is not rectified values and there are two threshold pairs: A low and a high threshold pair whereby each threshold pair is composed of two thresholds with the same absolute value but opposite sign. The absolute value of the members of the low threshold pair is lower than the absolute value of the members of the high threshold pair. The switches are controlled such that a switching happens after a delay after entering the low threshold interval, i.e. the region between the two members of the low threshold pair. The switches are further controlled to open, such that the current is interrupted, immediately after leaving the high threshold interval, i.e. the region between the two members of the high threshold interval. Preferably, the switches are controlled such that some of them are closed after entering the high threshold interval. In another embodiment, the switches stay open after entering the high threshold interval and some of the switches close after a delay after the next entry into the low threshold interval.

Obviously, the use of thresholds together with a rectified measurement value or together with the absolute value of the measurement value can be replaced by the use of threshold pairs with the same absolute value as the thresholds before in the case of non-rectified measurement values from which no absolute value is derived. Leaving a threshold interval in the non-rectified case is the equivalent to crossing a threshold in positive direction in the rectified case. Entering a threshold interval in the non-rectified case is equivalent to crossing a threshold in negative direction in the rectified case. The rectified case includes cases in which the measured property is rectified and cases in which the sign of the measurement result is taken away by any means.

Preferably, the first threshold or the absolute value of the members of the low threshold pair is chosen to be close to zero but still at an easily measurable value. Preferably, the third threshold or the absolute value of the members of the high threshold pair is chosen to be below the highest permissible current and above the current or voltage received most of the time in normal operation of the device.

Other advantageous embodiments and combinations of features come out from the detailed description below and the totality of the claims.

BRIEF DESCRIPTION OF THE DRAWINGS

The drawings used to explain the embodiments show:

FIG. 7 a detailed description of one embodiment of the inventive switching method.

In the figures, the same components are given the same reference symbols.

PREFERRED EMBODIMENTS

Figure 1:
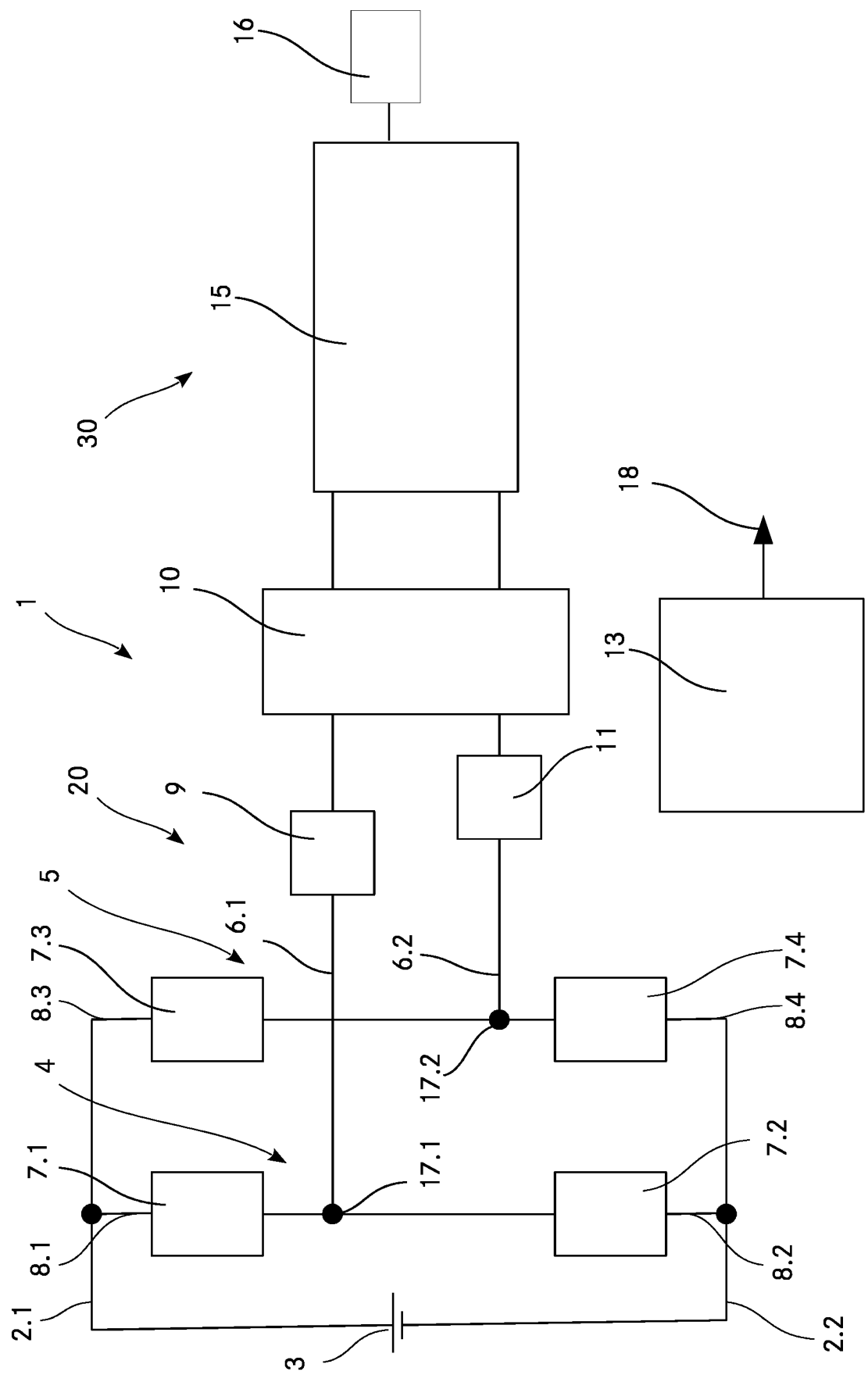
FIG. 1 a schematic circuit diagram of a state of the art LLC converter comprising a full bridge circuit.

FIG. 1 shows a schematic circuit diagram of a LLC converter connected to a load 16 with a full bridge circuit as it is known in the art. The circuit 1 basically comprises a primary side 20 shown on the left hand side of a transformer 10 and a secondary side 30 shown on the right hand side of the transformer 10. On the primary side 20 the circuit 1 comprises a power source 3 providing a direct current and a full bridge circuit comprising four switches 7.1-7.4. The secondary side 30 comprises a secondary circuit 15, which is not explained in greater detail. Furthermore, in the circuit diagram of FIG. 1 is shown a PWM signal generation unit 13 with an output 18 that is connected to the four switches 7.1-7.4.

The full bridge circuit comprises a first input terminal 2.1 and a second input terminal 2.2 both connected to the power source 3. Further, the bridge circuit comprises a first branch 4 and a second branch 5 each branch 4, 5 connected between the first input terminal 2.1 and the second input terminal 2.2.

The first branch 4 and the second branch 5 each comprises a first section 8.1, 8.3 between the first input terminal 2.1 and a centre tap 17.1, 17.2. The branches 4, 5 further comprise each a second section 8.2, 8.4 between the centre tap 17.1, 17.2 and the second input terminal 2.2. The first section 8.1 of the first branch 4 includes a first switch 7.1 and the second section 8.2 of the first branch 4 includes a second switch 7.2.

Analogously, the first section 8.3 of the second branch 5 comprises a third switch 7.3 and the second section 8.4 of the second branch 5 comprises a fourth switch 7.4. Preferably, the switches 7.1-7.4 in the bridge circuit are MOSFETs.

The centre tap 17.1 of the first branch forms an output terminal of the bridge circuit connected to the transformer 10, wherein in this connection line 6.1 a resonance choke 9 is located. Further, the centre tap 17.2 of the second branch 5 forming a second output terminal of the bridge circuit is connected to the transformer 10. In this connection line a resonance capacitor 11 is arranged.

The converter 10 comprises a primary side winding and a secondary side winding. Parallel to the primary side winding an inductor is arranged (not shown). The resonance choke 9, the inductor in the transformer 10 and the resonance capacitor 11 form a LLC circuit of the converter.

The PWM signal generation unit 13 comprises a voltage controlled oscillator (VOC) and a pulse steering circuit for generating a PWM signal for switching the switches 7.1-7.4 of the bridge circuit.

Instead of the PWM generation unit 13, there could be a PWM and/or FM signal generation unit.

Following the function of the circuit 1 as it is known in the art is described. The circuit shown in FIG. 1 allows establishing a first and a second current path which differs from the first current path. In order to establish the first current path the first switch 7.1 and the fourth switch 7.4 of the bridge circuit are closed at the same time while the second switch 7.2 and the third switch 7.3 are held open. Therefore, the current flows in the first current path from the power source 3 to the first input terminal 2.1 and then into the first branch 4 through the first switch 7.1 and further flows out of the bridge circuit at the centre tap 7.1 of the first branch 4. Subsequently, the current flows through the resonance choke 9 into the transformer 10 through the primary side winding. From the transformer 10 the current flows through the resonance capacitor 11 through the centre tap 17.2 of the second branch 5 into the second branch 5 and through the closed fourth switch 7.4 into the second terminal 2.2 and subsequently back to the power source 3.

After a certain time, which is depending on the pulse width of the PWM signal the first and the fourth switch 7.1, 7.4 are opened. Instead of the pulse width of the PWM signal, a frequency of a FM signal could be used. The switching frequency is preferably between 100 and 200 kHz. After a dead time, preferably in the range of 0.1 to 0.5 milliseconds, the second and the third switch 7.2, 7.3 are closed at the same time while the first and the fourth switch 7.1, 7.4 are held open. Therefore, the second current path is established. This means the current flows from the power source 3 in the first input terminal 2.1 and further in the second branch 5 through the third switch 7.3. The current further flows out of the second branch 5 at the centre tap 17.2 of the second branch 5 through the resonance capacitor 11 into the transformer 10 through the primary side winding. From the transformer 10 the current flows through the resonance chock 9 and through the centre tap 17.1 of the first branch 4 in the first branch 4 through the second switch 7.2 in the second input terminal 2.2 and further back to the power source 3. It is to be noted that in the second current path the current flows in the opposite direction through the connection lines 6.1, 6.2 and therefore through the transformer 10 compared to the first current path. After the closing of the second and third switch 7.2, 7.3 and after the subsequently following dead time the first and the fourth switch 7.1, 7.4 again are opened starting another cycle of the switching.

The direct current from the power source 3 can be chopped by a switching as described above. Since the current flows in the first current path in a first direction and the current flows in the second current path in a second direction opposite to the first direction an alternating current can be obtain on the secondary side of the converter 10. Therefore, the load 16 connected to the converter may be supplied by an alternating current.

Figure 2:
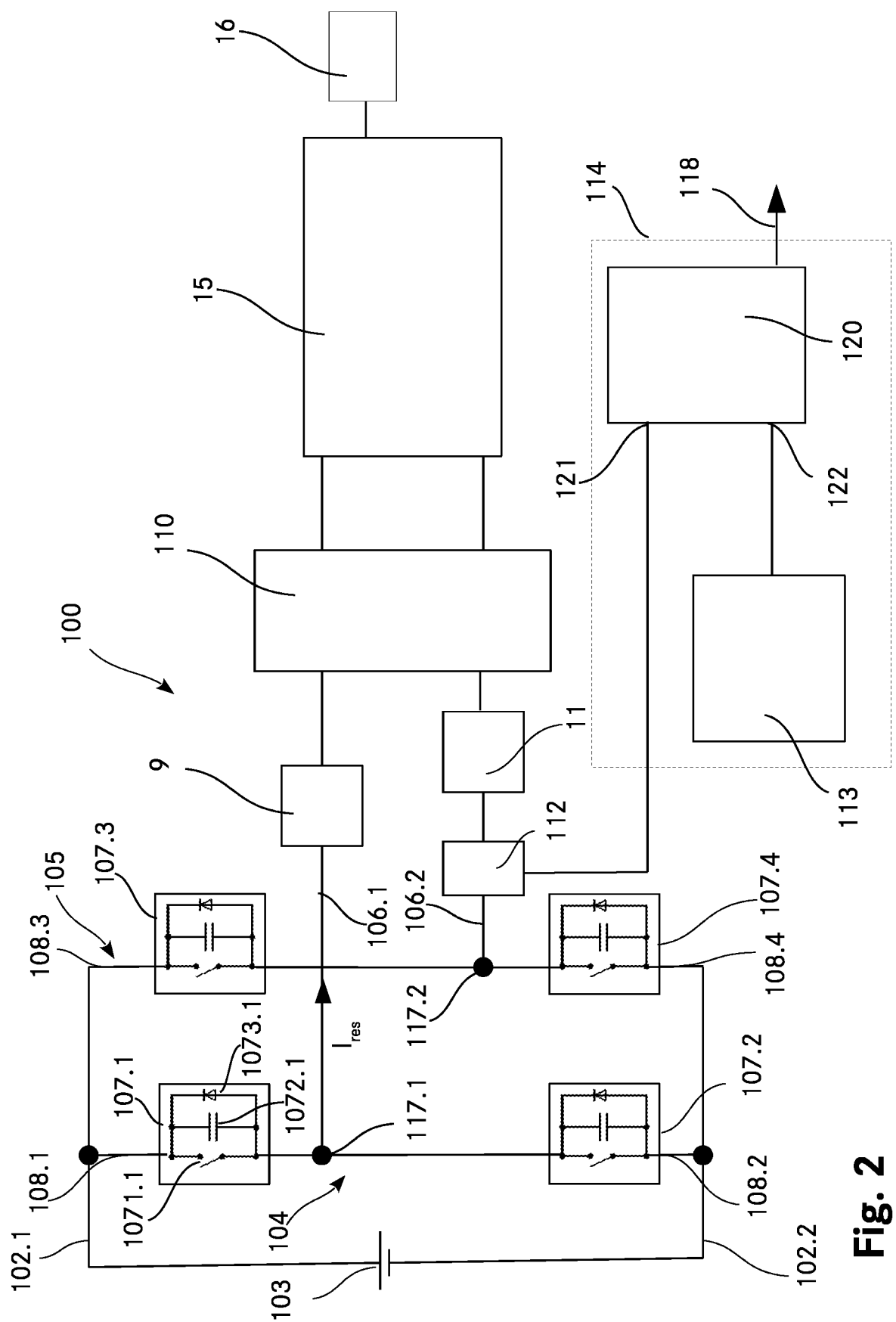
FIG. 2 a schematic circuit diagram of a LLC converter with a full bridge circuit and a controller according to the invention.

FIG. 2 shows a schematic circuit diagram of a LLC converter with a full bridge circuit according to the invention, where the method for switching the switches according to the invention may be carried out.

The circuit 100 of the converter according to the invention comprises all components as described above in FIG. 1. However, the switches 107.1, 107.2, 107.3, 107.4 are shown in more detail: The first switch 107.1 comprises a first unidirectional switch 1071.1, a first switch capacitance 1072.1 and a first body diode 1073.1 all arranged in parallel to each other. The second switch 107.2, the third switch 107.3 and the fourth switch 107.4 are constructed analogously. There is further an arrow pointing away from the centre tap of the first branch indicating one possible convention of a positive current direction $I_{res}$. With this convention, the first body diode 1073.1 and the fourth body diode are arranged in reverse direction with respect to a positive current. The first and the fourth unidirectional switches 1071.1 are in conducting direction with respect to the positive current direction. With respect to a positive current, the second and the third unidirectional switches are arranged in reverse direction and the second and third body diode are in conducting direction.

Additionally, to the circuit shown in FIG. 1 the circuit 100 shown in FIG. 2 comprises a measuring unit 112, a controller 114 including the PWM signal generating unit 113 and a protection circuit 120 for comparing a measured current value with a first threshold and for manipulating the pulses generated by PWM signal generation unit 113. The PWM signal generation unit 113 corresponds to the described PWM signal generation unit 13 of FIG. 1 as it is well known in the art.

The measuring unit 112 is located in the connection line 106.2 between the centre tap 117.2 of the second branch 105 and the transformer 110. Preferably, the measuring unit 112 is realised as current measuring circuit for measuring the current flowing in the connection line 106.2. The measuring unit 112 may also be located elsewhere in the bridge, for example between the centre tap 117.1 of the first branch 104 and the transformer 110 in the connection line 106.1. The current measuring circuit is connected to a first input 121 of the protection circuit 120. The protection circuit 120 comprises a second input 122, where the output of the PWM signal generation unit 113 is inputted. Furthermore, the protection circuit 120 comprises an output 118, which is connected to the four switches 107.1-107.4 of the bridge circuit.

Again, a FM and/or PWM signal generation unit could be used instead of the PWM signal generation unit 113.

Figure 3:
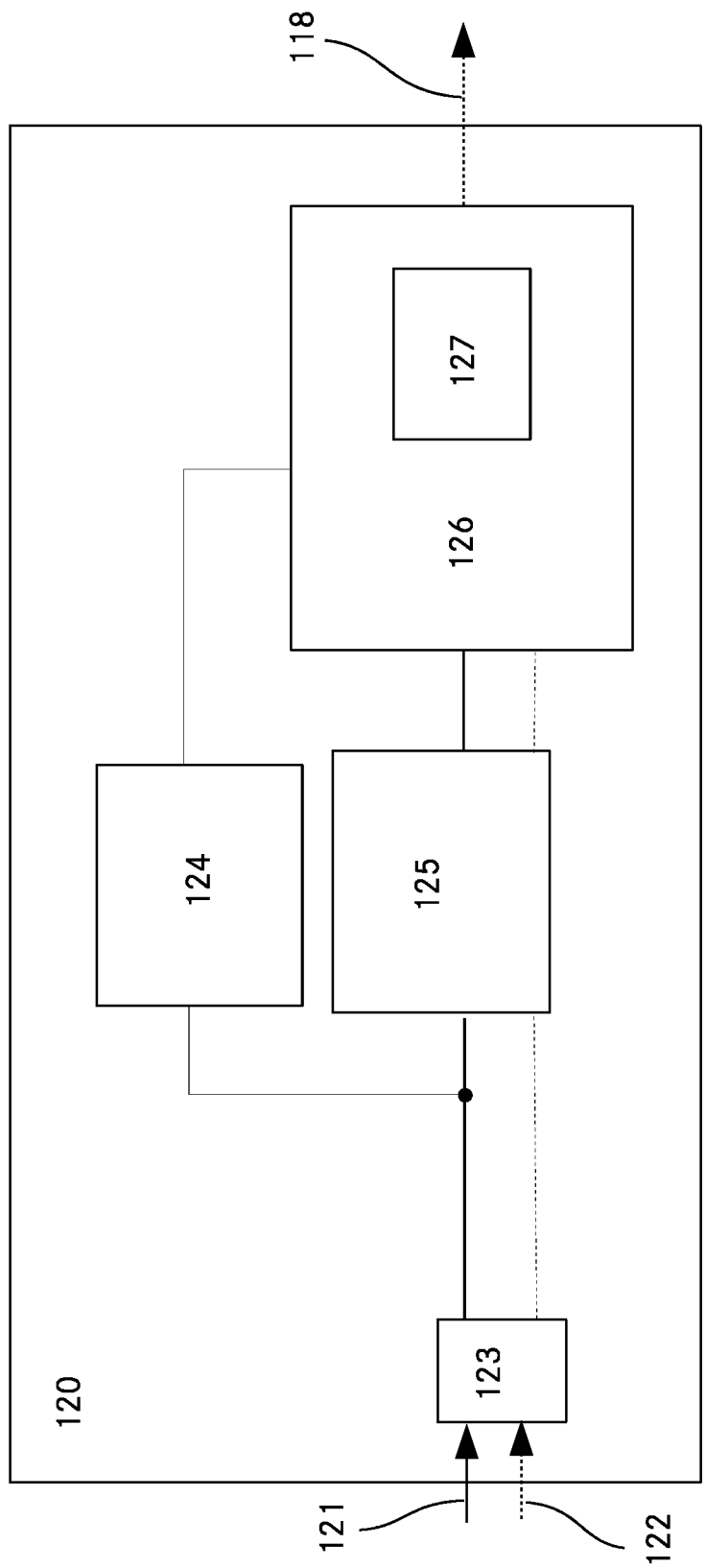
FIG. 3 a schematic circuit diagram of a protection circuit of the controller according to the invention.

Relating to FIG. 3 showing a detailed schematic circuit diagram of protection circuit 120 according to the invention the protection circuit 120 is described in detail. The protection circuit 120 comprises the first input 121, the second input 122, an output 118, a filter 123, an overcurrent protection circuit 124, a comparator 125 and a protection logic 126 for manipulating the pulses of the PWM signal including a delay timer circuit 127.

Also the frequency of a FM signal could be manipulated instead or in addition to the pulses of the PWM signal.

In FIG. 3, the flow of the information entered at the first input 121 comprising information about the current measured at the measuring unit 112 is illustrated by solid black lines. The flow of the PWM signal, produced by the PWM signal generation unit 113, entered at the second input 122, is indicated by dashed lines.

In the following section the elements of the protection circuit 120 are explained in detail. In FIG. 3 from left to right firstly the filter 123 is located at the first and second input 121, 122 and comprises a filter function and a bleeder resistor. After the filter 123 the overcurrent protection circuit 124 and the comparator 125 are arranged in parallel. The overcurrent protection circuit 124 and the comparator 125 get the information about the current measured at the measuring unit 112 as input. Both transmit their result, indicating the relation between the measured current and predefined thresholds to the protection logic 126. The protection logic 126 and the comparator 125 comprise also an input for the PWM signal. The protection logic 126 modifies the PWM signal in dependence of the results of the overcurrent protection circuit 124 and the comparator 125.

The overcurrent protection circuit 124 compares either an absolute value of the measured current with a third threshold or it compares the measured current to a high threshold pair, arranged symmetrically around 0 amperes. Preferably, the third threshold is set at a value of 30 ampere or the high threshold pair comprises two thresholds with set values of +/−30 A. The overcurrent protection circuit 124 can be or can comprise a comparator. If an absolute value of the measured current exceeds the third threshold or if the value of the measured current lies outside of the interval defined by the high threshold pair, an overcurrent is detected and the overcurrent protection circuit 124 opens the switches as described in detail below.

The comparator 125 detects the preliminary closing times of the switches by observing jumps in the PWM signal. Depending on which of the PWM signals shows the jump, the comparator 125 chooses the appropriate direction or the appropriate threshold for the comparison with the current signal. If the current direction is suitable for the switch controlled with the PWM signal showing the jump or if the absolute value of the current is below the threshold of about 1 Ampere, the comparator 125 passes a signal to protection logic 126 indicating that the PWM signal should remain unchanged. However, if the comparator 125 detects that the current direction is not suitable and that the absolute value is above the threshold of about 1 ampere, the comparator 125 passes a signal to the protection logic 126 indicating to keep the PWM signal low. The comparator 125 continues to observe the current and the PWM signal. If a threshold crossing is detected before the PWM signal in the input of the comparator 125 has dropped, the comparator 125 issues a signal to the protection logic 126 to stop with keeping the PWM signal down as soon as the delay time is over. The protection logic 126 will start a delay timer circuit 127 in this case and stop with keeping the PWM signal low once the delay timer circuit 127 allows it. In the case that the PWM signal is still indicating a closed switch at this point in the time, the switch will close. In the case that the PWM signal has dropped to zero because the preliminary opening time of the switch has already passed, the action of the protection logic 126 has no consequence.

Instead of using a single threshold and a detection of the current direction, the comparator 125 can use the criteria "above a positive threshold" or "below a negative threshold" in dependence of the switch controlled by the PWM signal with the jump.

The protection logic 126 modifies the PWM signal inputted from the PWM signal generation unit 113. This means the protection logic widens or narrows the pulse width in dependency of the result of the comparison.

Instead of a PWM signal, a FM signal inputted from a PWM and/or FM signal generation unit could be modified, which means that the protection logic increases or decreases the frequency in dependency of the result of the comparison.

If the comparator 125 indicates that the PWM signal should be modified because of an approaching zero-crossing of the measured current, the output signal is delayed by the delay timer circuit 127. Preferably, the output signal is not delayed if the overcurrent protection circuit 124 indicates that the PWM signal should be modified because of a detected overcurrent. The reason for that delay in the case of the comparator 125 requesting a modification is the following:

The optimal time for switching the switches is the instant when no current or almost no current flows through the switches, e. g. if the switches are not in a conducting state. However, it is hard to measure a very small current flow. Therefore, the first threshold or the first set of thresholds is set at a value that can easily and reliably be measured. Preferably, the first threshold is set in the range of one ampere or the first set of thresholds is set in the range of +/−1 A. Since the current course is usually a sinusoidal waveform the gradient of the current in the region of the first threshold can be computed in advanced. Consequently, the time between the crossing of the first threshold and the instant when the current actually equals zero can be computed. Accordingly, the delay time can be set such that the switching of the switch 107.1-107.4 is carried out, when the current reaches zero or almost zero. The computing of the delay time is preferably carried out in advance and set at a constant value. In one embodiment the gradient of the current and the corresponding delay time may be computed by the controller on line during the operation of the converter. The computing of the gradient and the delay time may be carried out in a microprocessor or the like (not shown).

In direction of the signal flow after the logical circuit 126 and after the delay time circuit 127 the PWM signal and/or the FM signal is outputted at the output 118 of the protection circuit 120 to the corresponding switches 107.1-107.4 of the bridge circuit.

In another embodiment, the overcurrent protection circuit 124 may be located between the input filters 123 and the comparator 125: The overcurrent protection circuit 124 may transmit a signal directly to the protection logic 126 and stop the signal from further being analysed by the comparator 125. It is also possible that the overcurrent protection circuit 124 modifies the PWM signal by itself in dependence of a detected overcurrent and that also the protection logic 126 is bypassed. Such a bypassing of the comparator 125 increases the speed of a reaction to a possible overcurrent or overvoltage.

Following the steps of the method according to the invention carried out in the circuit 100 as shown in FIG. 2 are described. In the operation of the converter the PWM signal generation unit 113 with its voltage controlled oscillator and pulse steering circuit generates a PWM signal with a variable frequency in the range of 100 to 200 kHz for switching the four switches 107.1-107.4 of the bridge circuit as it is known in the art. Since the circuit 100 according to the invention comprises a current measuring device 112 in the connection line the current flowing through the connection line can be measured. Measuring the current means detecting the absolute value of the current but also the flow direction of the current. The measured information is inputted into the protection circuit 120 through in the first input 121.

Subsequently, the protection circuit 120 processes the measured value. Therefore, the comparator 125 of the protection circuit 120 compares the absolute value of the measured current with the first threshold of one ampere.

If the absolute value is equal or falls below the first threshold or if the value is inside the interval defined by the low threshold pair the inputted PWM or FM signal is forwarded to the output of the protection circuit 120 without any modification. The switches 107.1-107.4 of the bridge circuit are switched depending on the width of the PWM signal or the frequency of the pulses in the FM signal as it is described above and as it is well known in the art.

However, if the absolute value of the measured current has an unsuitable direction and exceeds the first threshold the protection logic 126 of the protection circuit 120 delays a leading edge of the switching pulse in the case of a PWM signal or delays a change in the frequency of a FM signal. For example, after the cycle of the first current path is terminated and therefore the first and the fourth switch 107.1, 107.4 are opened and if the current remaining in the circuit lies above the first threshold the protection logic 126 delays the leading edge of the switching pulse for closing the second and third switch 107.2, 107.3. Hence, the leading edge of the switching pulse is delayed until the absolute value of the measured current is equal or falls below the first threshold. Then the protection logic 126 outputs the pulse in order to close the second and third switch 107.2, 107.3. But the leading edge of the switching pulse is further delayed by delay circuit 127. Preferably, the delay circuit 127 delays the leading edge several nanoseconds such that the switching is carried out when the current in the circuit following a sine half wave reaches zero. Since in the described case the leading edge of the switching pulse is delayed but the switching frequency remains unchanged the pulse width of the switching pulse is narrower than the pulse width of a non-modified pulse.

Another modification of the PWM signal or the FM signal is carried out by the overcurrent protection logic 124 if the absolute value of the measured current exceeds the third threshold preferably set at 30 ampere. During operation of the converter the comparator of the overcurrent protection circuit 124 compares the absolute value of the measured current with the third threshold. If the absolute value exceeds the threshold of 30 ampere the switches being closed at this instant are immediately opened. Therefore, the current path is interrupted and may remain interrupted for the rest of the half-period. This means the trailing edge of the switching pulse is moved such that the switch is opened earlier than in normal operation. That means the switch is opened at the instant when an overcurrent is detected. Therefore, the pulse width of such a modified pulse is narrower than the pulse width of a non-modified pulse. In the case of a FM signal, the time interval during which the pulse frequency indicates a closed switch is shorter than it is the case without the modification. In one embodiment, the switches remain open until the measured current falls below the third threshold of 30 ampere. In another embodiment, the switch remains open for the rest of the current half-period of the input current.

In another embodiment the controller 114 comprises additional to the above described functions a reverse current protection. Therefore, the protection circuit 120 comprises additionally a reverse current protection circuit (not shown). This circuit ensures that in normal operation the switch remain closed during the pulse width if the current flows in the predetermined direction. However, if the current flows in the direction of the body diode of the switch during a predetermined time the controller 114 opens the concerned switch 107.1-107.4 in order to protect the bridge circuit. This means the controller 114 moves the trailing edge of the switching pulse to an earlier instant such that the switch 107.1-107.4 is opened if a reverse current is detected.

Figure 4:
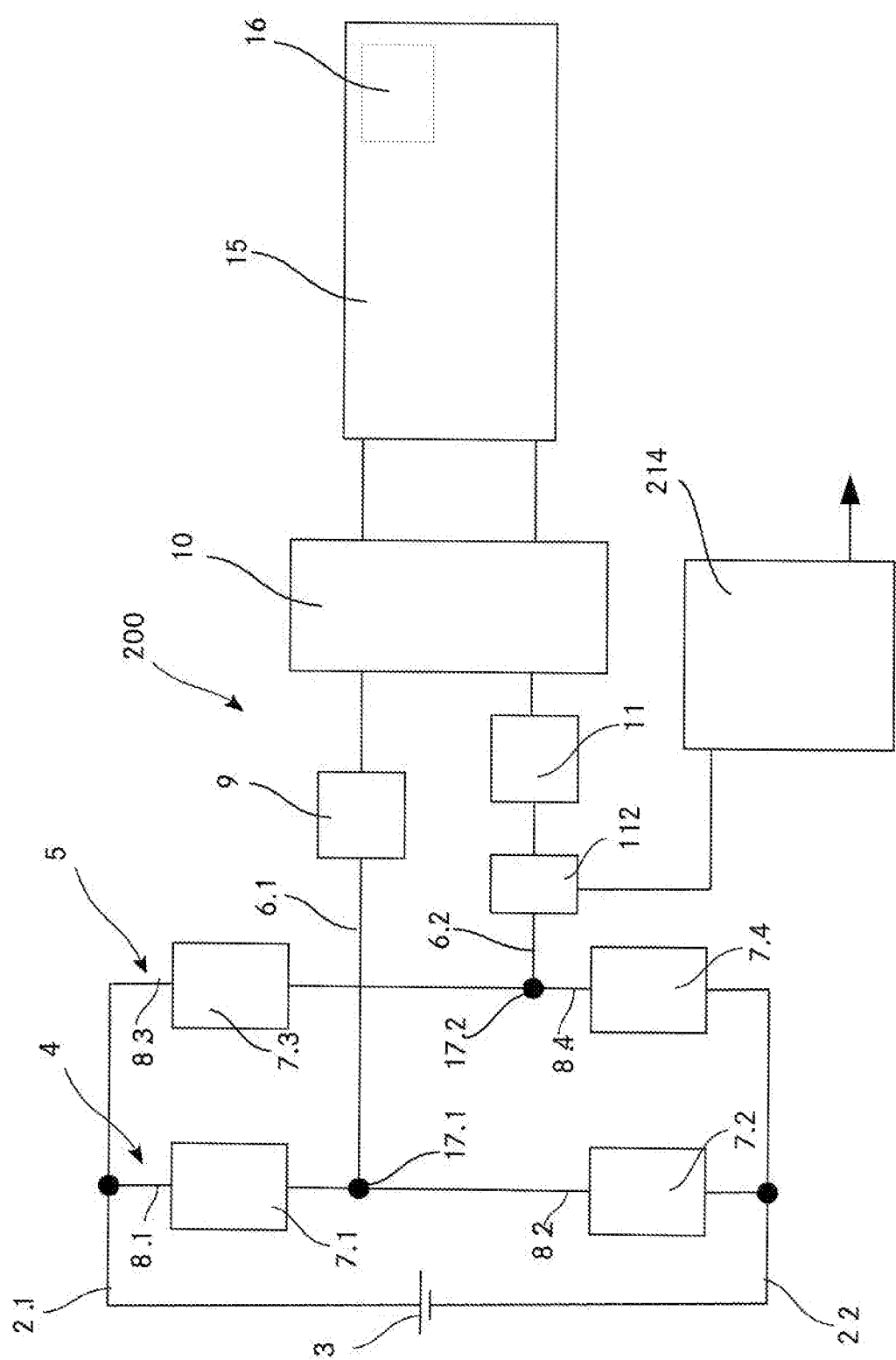
FIG. 4 another embodiment of the circuit as shown in FIG. 2 with a compact controller.

FIG. 4 shows another embodiment of the circuit 200 according to the invention. This embodiment differs from the above mentioned embodiment in that the generation of the PWM and/or FM signal and the protection circuit are combined into one single control unit 214, for example in a microprocessor. Therefore, in contrast to the above embodiment the PWM and/or FM signal is not generated and subsequently modified but the PWM and/or FM signal is from the beginning generated in dependency of the comparison of the measured current with the first and the third threshold.

Figure 5:
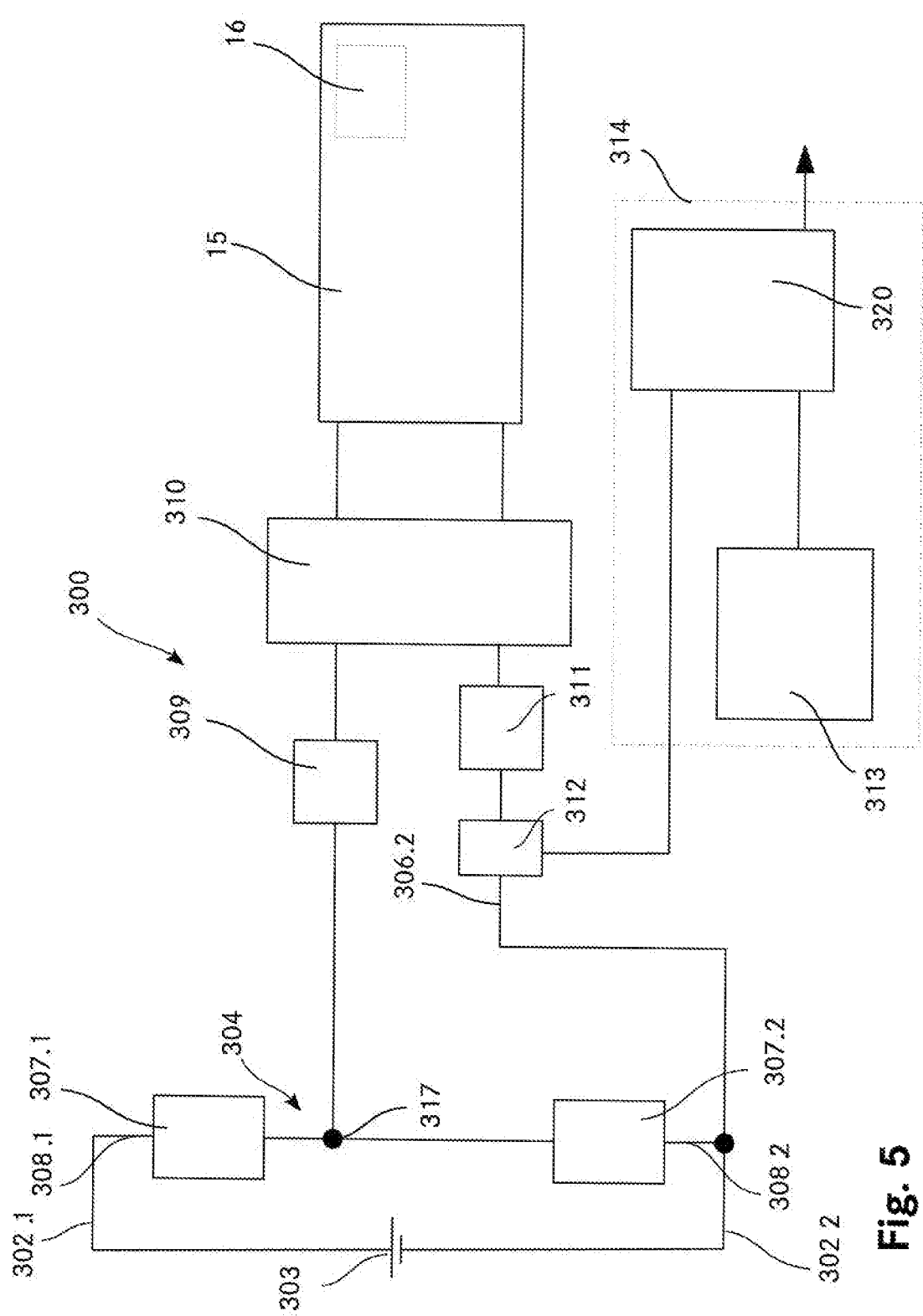
FIG. 5 another embodiment of the LLC converter comprising a half bridge circuit and a controller according to the invention.

FIG. 5 shows a schematic circuit diagram of a half bridge circuit for a converter according to the invention. The half bridge circuit comprises only one branch 304 including a first section 308.1 between a first input terminal 302.1 and a centre tap 317 and including a second section 308.2 between the centre tap 317 and a second input terminal 302.2. The first section 308.1 includes a first switch 307.1 and the second section 308.2 includes a second switch 307.2. In contrast to the circuit 100 of the full bridge as described above and shown in FIG. 2 the connection line 306.2 from the transformer 310 is not connected to a second branch but to the second input terminal 302.2. That leads to a slightly different function of the circuit 300 and in particular to a different second current path.

In order to establish the first current path the first switch 307.1 of the branch 304 is closed. The current may flow from the power source 303 in the first input terminal 302.1 and through the first switch 307.1. Since the second switch 307.2 in the branch 304 is opened the current flows through the centre tap 317 out of the bridge circuit through the resonance choke 309 into the transformer 310. From the transformer 310 the current flows further through the resonance capacitor 311 and through the measuring unit 312 to the second input terminal 302.2 and back to the power source 303.

In order to establish the second current path the first switch 307.1 is opened and the second switch 307.2 is closed. The current flows out of the resonance capacitor 311 through the transformer 310 to the centre tap 317 and subsequently through the second section 308.2 of the branch 304 and through the second switch 307.2 into the second input terminal 302.2. From the input terminal 302.2 the current may flow back through the measuring unit 312 to the resonance capacitor 311. Therefore, the current flows in the second current path in an opposite direction through the transformer 310 than in the first current path.

The controller 314 comprising the PWM and/or FM signal generation unit 313 unit and the protection circuit 320 corresponds to the controller 114 of the first embodiment shown in FIGS. 2 and 3. The switching of the switches 307.1, 307.2 in the half bridge as shown in FIG. 5 differs from the first embodiment in that only one switch 307.1, 307.2 is switched per PWM pulse or per FM signal period. The method including the steps of measuring a current value, the comparing an absolute value with the first and the third threshold and the modifying of the PWM pulses or the FM signal accordingly is the same as described above in conjunction with FIG. 2.

Figure 6:
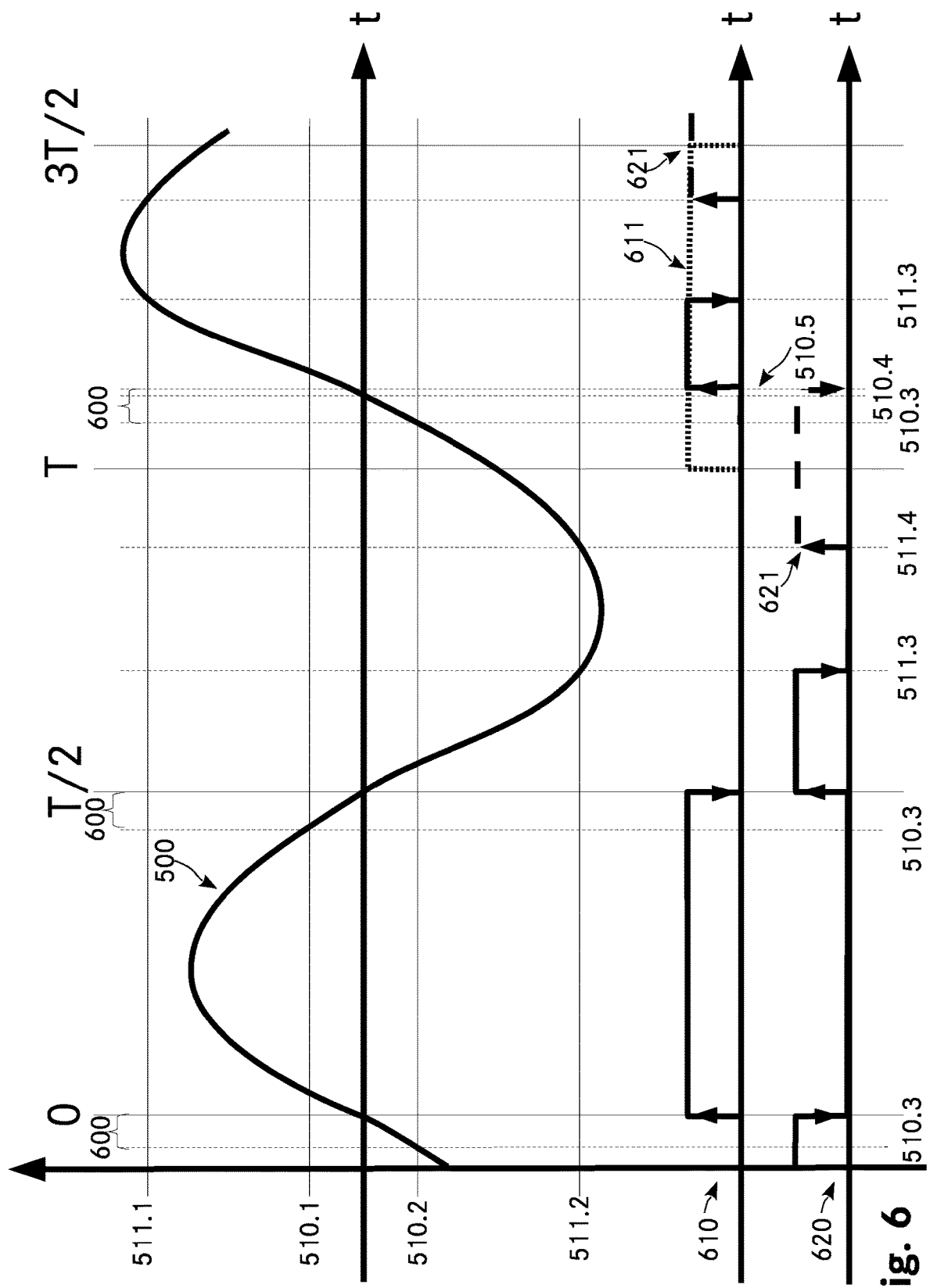
FIG. 6 a detailed description of the inventive switching method applied in the case of a measurement of an unrectified current and using threshold pairs.

FIG. 6 illustrates one possible the switching method in more detail. FIG. 6 shows the current measurement 500 which is approximately a sine with a period of T. However, there are small variations in amplitude and frequency. The current measurement 500 is depicted in a coordinate system with the time increasing along the horizontal axis and the current value shown on the vertical axis. The current measurement 500 is in this example conducted at a place where the current is not yet rectified.

In the same coordinate system as the current measurement 500, a first threshold 510.1 and a second threshold 510.2 forming a low threshold pair as well as a third threshold 511.1 and a fourth threshold 511.2 forming the high threshold pair are depicted as vertical lines. The first threshold 510.1 is located for example at a value of 1 ampere. The second threshold 510.2 is located for example at a value of −1 ampere. The third threshold 511.1 is located for example at a value of 30 ampere. The fourth threshold 511.2 is located for example at a value of −30 ampere.

Vertical dashed lines indicate some threshold crossings of importance for the detailed explanation of the switching method. Lines indicating that the current measurement 500 enters the first threshold interval are labelled 510.3. Lines indicating a crossing of the zero current are labelled 510.4. Lines indicating that the current measurement 500 leaves the high threshold interval are labelled 511.3. Lines indicating that the current measurement 500 enters the high threshold interval are labelled 511.4. An entering of the low threshold interval 510.3 happens when crossing the second threshold 510.2 in the positive direction or when crossing the first threshold 510.1 in the negative direction. A leaving of the high threshold interval 511.3 happens when crossing the fourth threshold 511.2 in the negative direction or when crossing the third threshold 511.1 in the positive direction. An entering of the high threshold interval 511.4 happens when crossing the fourth threshold 511.2 in the positive direction or when crossing the third threshold 511.1 in the negative direction.

The low threshold interval is the current range between the two members of the low threshold pair 510.1, 510.2. The high threshold interval is the current range between the two members of the high threshold pair 511.1, 511.2.

A delay 600 is the time duration between the detection of the entering of the low threshold interval 510.4 and the switching time 510.5. It is supposed to be a good estimate of the time duration between the entering of the low threshold interval 510.4 and the zero-crossing 511.3, especially in the case of the current measurement 500 being an undisturbed sine.

In order to make the period of the undisturbed sine visible, solid vertical lines are plotted in a distance of ½ T. T is the period of the undisturbed sine.

FIG. 6 shows in addition the switching signals 610 and 620. The switching signal 610 indicates the signal for controlling the switches 7.1 and 7.4 while the switching signal 620 indicates the signal for controlling the switches 7.2 and 7.3. A positive value of a switching signal 610 or 620 indicates that the respective switch or switches are closed while a value of zero indicates that the respective switches are opened. Arrows indicate the switching process: An arrow pointing up indicates a closure of the respective switches while an arrow pointing down indicates that the respective switches are opened. Current can flow through a closed switch.

The switching method according to the invention asks for the detection of the entering of the low threshold interval 510.3. One delay 600 later, the switching is executed: Signal 620 which was positive before, drops to zero and signal 610 increases to a positive value. Half a period of the sine later, there is again an entry of the low threshold interval 510.3 and a delay 600 later, the switching is executed again: Signal 620 which was zero increases to a positive value while signal 610 which had a positive value drops to zero. The sine is undisturbed in this first half of a period in the given example, the delay 600 is chosen such that the switching happens essentially exactly at the zero crossing of the current.

In the following half period, the current rises more than considered save: The current measurement crosses 500 the fourth threshold 511.2 in the negative direction. This indicates a leaving of the high threshold interval 511.3. Consequently, the overcurrent protection reacts and causes all switches to open: Both signal 610 and 620 drop to zero. A short time later, the current measurement 500 drops again and crosses the fourth threshold 511.2 in a positive direction. In one embodiment 621, this causes the switching signal 620 to rise to a positive value again and therefore to close the switches controlled by the signal 620 again. In another embodiment, the switching signal 620 only starts to rise again after the next negative crossing of the first threshold 510.1.

At the end of one period of the undisturbed sine, one might expect a zero crossing of the current measurement 500 and in prior art methods 611, a switching would occur in this moment. However, in this example, the frequency of the sine is disturbed. With the method according to the invention, the switching is trigged by entering the low threshold interval 510.3. This detection is followed by the delay 600 and then the switching 510.5 happens. In the disturbed situation, the switching 510.5 may happen slightly before or after the actual zero-crossing 510.4. However, the current through the switches is still small at the time of switching 510.5 and it is much lower than it was at the expected time of the zero crossing estimated by assuming a constant frequency of the current. The switching 510.5 closes the switches controlled by signal 610. In the embodiment 621 the switching 510.5 opens the also the switches controlled by signal 620. In another embodiment, the switches controlled by signal 620 are still open due to the reaction of the overcurrent protection earlier.

Finally, the current measurement 500 crosses the third threshold 511.1 in the positive direction which triggers again the overcurrent protection with the result of all switches being opened as indicated by all switching signals 610 and 620 dropping to zero.

The switching method was explained in detail for a case using an unrectified current measurement and threshold pairs. Using threshold and a rectified current measurement, the method can be applied in an analogue way.

Another embodiment of the switching method is illustrated in FIG. 7

FIG. 7 shows a diagram similar to the diagram shown in FIG. 6: Time is plotted on the horizontal axis and the vertical axis is shared by three different lines: on top the current measurement 500, below it the control signal 610 for the first and the fourth switch 107.1 and 107.4, and on the bottom the control signal 620 for the second and the third switch 107.2 and 107.3.

The time axis is divided in intervals of equal length of T/2. 1/T is the desired output frequency of the bridge circuit. The divisions determine the preliminary closing times 803.1 of the first and the fourth switch 107.1, 107.4, the preliminary closing times 803.2 of the second and the third switch 107.2 and 107.3, the preliminary opening times 804.1 of the first and the fourth switch 107.1, 107.4 and the preliminary opening times 804.2 of the second and the third switch 107.2 and 107.3:

The preliminary closing times 803.1 of the first and the fourth switch 107.1, 107.4 are at the points of time xT with x being an integer and including zero.

The preliminary closing times 803.2 of the second and the third switch 107.2 and 107.3 are at the point of time xT+T/2 with x being an integer and including zero.

The preliminary opening times 804.1 of the first and the fourth switch 107.1, 107.4 are at the point of time xT+T/2−DT with x being an integer and including zero and DT indicating a dead time 700 of known and fixed length.

The preliminary opening times 804.2 of the second and the third switch 107.2 and 107.3 are at the point of time xT−DT with x being an integer and including zero and DT indicating a dead time 700 of known and fixed length.

In the case at hand, a positive current 500 can flow through the unidirectional switches of the first and the fourth switch 107.1, 107.4 if they are closed and a negative current 500 can flow through the unidirectional switches of the second and the third switch 107.2, 107.3 if they are closed.

In the switching method at hand, closing of the first and the fourth switch 107.1, 107.4 is therefore allowable if the current is negative or below or equal to the first threshold 510.1, which is a positive threshold close to zero ampere, typically about 1 ampere. Analogously, closing of the second and the third switch 107.1, 107.4 is allowable if the current is positive or above or equal to the second threshold 510.2, which is a negative threshold close to zero ampere, typically about −1 ampere.

The time 0 is a preliminary closing time 803.1 of the first and the fourth switch 107.1, 107.4. At the time 0, the current 500 has a negative value and is therefore also below the first threshold 510.1. Consequently, the switching signal 610 gets a value which indicates a closing of the first and the fourth switch 107.1, 107.4. As the current 500 does not trigger the over-current protection during the preliminary closure duration 805, the switching signal 610 keeps this value until the preliminary opening time 804.1 is reached. At the preliminary opening time 804.1, the switching signal 610 drops to a value indicating an opened first and fourth switch 107.1, 107.4.

The situation is analogue with respect to the second and the third switch, only shifted in time by T/2: The time T/2 is a preliminary closing time 803.2 of the second and the third switch 107.1, 107.4. At the time T/2, the current 500 has a positive value and is therefore also above the second threshold 510.2. Consequently, the switching signal 620 gets a value which indicates a closing of the second and the third switch 107.2, 107.3. As the current 500 does not trigger the over-current protection during the preliminary closure duration 805, the switching signal 620 keeps this value until the preliminary opening time 804.2 is reached. At the preliminary opening time 804.2, the switching signal 620 drops to a value indicating an opened second and third switch 107.2, 107.3.

At the time T, again a preliminary closing time 803.1 of the first and the fourth switch 107.1, 107.4, the current 500 is again negative and therefore the first and the fourth switch 107.1, 107.4 are controlled by the signal 610 to close as planned. However, for example to a sudden change in the load on the output side of the circuit, the current 500 increases and crosses the third threshold 511.1. This triggers the overcurrent protection and causes the signal 610 to drop immediately to a value indicating the opening of the first and the fourth switch 107.1, 107.4. Compared with the nominal situation shown in the time from 0 to T, a lagging edge modulation 801 of the control signal 610 has occurred. In FIG. 7, the difference between the lagging edge modulated control signal influenced by the overcurrent protection and the standard control signal defined by the preliminary opening and closing times is marked as hashed area. The lagging edge modulation 801 increases the time during which all four switches 107.1, 107.2, 107.3, 107.4 are open. The overcurrent protection works similar when a negative current falls below the fourth threshold 511.2. In this case also, the switches closed at the moment of this threshold crossing are opened immediately.

At the time 3T/2, again a preliminary closing time 803.2 of the second and the third switch 107.2, 107.3, the current 500 is negative. In FIG. 7, the current 500 at the time 3T/2 is marked with an arrow. This current 500 at the time 3T/2 is also below the second threshold 510.2. Therefore, the closing of the second and the third switch 107.2, 107.3 is prevented: The control signal 620 stays at a low value indicating that the second and the third switch 107.2, 107.3 are open. At the time 510.21, the current 500 crosses the second threshold 510.2. This triggers a delay 600 and after this delay 600, the control signal 620 gets a value indicating a closing of the second and the third switch. The control signal 620 remains at this value and keeps therefore the second and the third switch closed until the preliminary opening time 804.2 is reached. Compared with the nominal situation shown in the time from 0 to T, a leading edge modulation 802 of the control signal 620 has occurred. In FIG. 7, the difference between the leading edge modulated control signal influenced by the switch protection and the standard control signal defined by the preliminary opening and closing times is marked as hashed area. The leading edge modulation 802 increases also the time during which all four switches 107.1, 107.2, 107.3, 107.4 are open.

At the time 2T, again a preliminary closing time 803.1 of the first and the fourth switch 107.1, 107.4, the current 500 is positive. The value of the current 500 at the time 2T is marked by an arrow. The value of the current 500 at the time 2T is below the first threshold 510.1. Therefore, the control signal 610 rises to the value indicating the closing of the first and the fourth switch at the preliminary closing time 803.1. The control signal falls to the value indicating the opening of the first and the fourth switch when either the current 500 rises above the third threshold 511.1 or falls below the fourth threshold 511.2 and triggers thereby the overcurrent protection or if the preliminary opening time 804.1 is reached.

In summary, it is to be noted that a method and a corresponding switch controlling arrangement is provided that allows a safe and reliably switching of the switches such that the lifetime of the switches can be increased.

The invention claimed is:
1. A method for controlling a first and a second switch of a bridge circuit, wherein the bridge circuit comprises a first and a second input terminal for connecting a power source, a first branch connected between the first and the second input terminal and including a first section between the first input terminal and a centre tap forming an output terminal of the bridge circuit and including a second section between the centre tap and the second input terminal, where the first section includes a first switch and the second section includes a second switch, wherein
  A. there are predetermined preliminary closing and opening times of the first and the second switches and
  B. wherein the threshold is a first threshold with a positive sign and wherein there is a second threshold with a negative sign and
    whereby the method is characterized by the steps of
      a) determining a measured value by measuring a current in the bridge circuit or by measuring a voltage in the bridge circuit,
      b) carrying out a comparison of the measured value with a threshold and
      c) controlling a switching of the first and the second switch of the first branch in dependency of a result of said comparison,
  C. wherein the step of carrying out the comparison of the measured value with the threshold comprises the step of
    i. determining at a preliminary closing time of the first switch if the measured value is equal or smaller than the first threshold and
    ii. determining at a preliminary closing time of the second switch if the measured value is equal or greater than the second threshold and
  D. wherein the step of controlling the switching of the first and the second switch of the first branch in dependency of the result of said comparison comprises the following steps:
    i. if the result of the comparison is positive, and
      a) and if the comparison was done at the preliminary closing time of the first switch, closing the first switch immediately
      or
      b) if the comparison was done at the preliminary closing time of the second switch, closing the second switch immediately
    or
    ii. if the result of the comparison is negative, and
      a) if the comparison was done at the preliminary closing time of the first switch
        closing the first switch at or after a time of a subsequent negative crossing of the first threshold by the measured value
        if such a crossing occurs after the preliminary closing time at which the comparison was done and
        if the expected time of closing the first switch falls in a time frame between the preliminary closing time at which the comparison was done and the following preliminary opening time of the first switch
      or
      b) and if the comparison was done at the preliminary closing time of the second switch
        closing the second switch at or after the time of a subsequent positive crossing of the second threshold by the measured value
        if such a crossing occurs after the preliminary closing time at which the comparison was done and
        if the expected time of closing the second switch falls in a time frame between the preliminary closing time at which the comparison was done and the following preliminary opening time of the second switch.

2. The method according to claim 1, wherein carrying out the comparison includes the step of detecting, when an absolute value of the measured value crosses the threshold.

3. The method according to claim 1, wherein
  A. the preliminary closing times of the first switch have a time difference equal to a first duration (T) from each other and
  B. the preliminary closing times of the second switch have a time difference from each other which equals the first duration (T) and a time difference which equals half of the first duration (T/2) from the preliminary closing times of the first switch
  C. wherein the first duration (T) is the reciprocal of a desired output frequency of the bridge circuit and
  D. wherein there is a preliminary closure duration which is less than half of the first duration (T/2) and
  E. wherein the preliminary opening times of the first or the second switch occur the preliminary closure duration after the preliminary closing times of the respective switch and
  F. wherein the difference between half of the first duration (T/2) and the preliminary closure duration defines a dead time.

4. The method according to claim 1 wherein the bridge circuit comprises a first body diode connected in parallel to the first switch and a second body diode connected in parallel to the second switch and wherein the first and the second switches are unidirectional switches and wherein the body diodes are arranged such that their conducting direction is opposite to the conducting direction of the unidirectional switch they are connected to in parallel and wherein the measured value is the current, preferably the current in a connection line, and wherein a sign of the current is chosen such that the first body diode is in reverse direction with respect to a positive current.

5. The method according to claim 1, wherein controlling the switching of the first and the second switch includes waiting a delay after a threshold crossing, in the case of the comparison which is negative before closing the first or the second switch if a duration between the threshold crossing and the preliminary opening time of the respective switch is greater than the delay.

6. The method according to claim 1, wherein the measured value is a current and wherein the threshold is a current value between 0 and 10 amperes.

7. The method according to claim 1, wherein controlling the switching of the first and second switch comprises opening the first or the second switch if an absolute value of the measured value is equal or exceeds a third threshold which is greater than the first threshold.

8. The method according to claim 1, wherein the bridge circuit comprises a second branch connected between the first and the second input terminal and including a first section between the first input terminal and a centre tap and including a second section between the centre tap and the second input terminal, where the first section includes a third switch and the second section includes a fourth switch wherein the method comprises the step of
  controlling a switching of the third and fourth switches of the second branch in dependency of a result of said comparison.

9. A controller for controlling a switch of a bridge circuit, where the bridge circuit comprises a first and a second input terminal for connecting a power source, a first branch connected between the first and the second input terminal and including a first section between the first input terminal and a centre tap and including a second section between the centre tap and the second input terminal, where the first section includes a first switch and the second section includes a second switch, characterized in that the controller comprises
- a) an input for receiving a measured value of a current or of a voltage in the bridge circuit provided by a measuring unit;
- b) a comparison unit for comparing the measured value with the threshold, preferably for comparing the measured value with a first and a third threshold, and
- c) drive means for controlling a switching of the first and the second switch of the first branch in dependency of a result of said comparison
- d) wherein the comparison unit and the drive means are adapted to be able to execute the steps of the method according to claim 1.

10. A switch control arrangement for a converter, comprising the controller according to claim 9 and a measuring unit for measuring a current or a voltage in the bridge circuit.

11. A converter comprising the switch control arrangement according to claim 10 and the bridge circuit.

12. A method for controlling a first and a second switch of a bridge circuit, where the bridge circuit comprises a first and a second input terminal for connecting a power source, a first branch connected between the first and the second input terminal and including a first section between the first input terminal and a centre tap forming an output terminal of the bridge circuit and including a second section between the centre tap and the second input terminal, where the first section includes a first switch and the second section includes a second switch, wherein
- A. there are predetermined preliminary closing and opening times of the first and the second switches whereby the method is characterized by the steps of
- a) determining a measured value by measuring a circuit in the bridge circuit or by measuring a voltage in the bridge circuit,
- b) carrying out a comparison of the measured value with a threshold and
- c) controlling a switching of the first and the second switch of the first branch in dependency of a result of said comparison,
- B. wherein the step of carrying out the comparison of the measured value with the threshold comprises the step of
  - i. determining at every preliminary closing time if the measured value indicates a direction suitable for the switch associated with the preliminary closing time and
  - ii. if this is not the case, determining if the absolute value of the measured value is equal or lower than the threshold
- C. wherein the step of controlling a switching of the first and the second switch of the first branch in dependency of the result of said comparison comprises the following steps:
  - i. if the result of the comparison is positive,
    - a) closing the switch associated with the preliminary closing time at which the comparison was done or
  - ii. if the result of the comparison is negative,
    - a) closing the switch associated with the preliminary closing time at which the comparison was done at or after the time of a subsequent crossing of the threshold by the absolute value of the measured value if such a crossing occurs after the preliminary closing time at which the comparison was done and
    if the expected time of closing falls in a time frame between the preliminary closing at which the comparison was done and the following preliminary opening time of the switch associated with the preliminary closing time.

13. The method according to claim 12, wherein
- [A] the preliminary closing times of the first switch have a time difference equal to a first duration (T) from each other and
- [B] the preliminary closing times of the second switch have a time difference from each other which equals the first duration (T) and a time difference which equals half of the first duration (T/2) from the preliminary closing times of the first switch
- [C] wherein the first duration (T) is the reciprocal of a desired output frequency of the bridge circuit and
- [D] wherein there is a preliminary closure duration which is less than half of the first duration (T/2) and
- [E] wherein the preliminary opening times of the first or the second switch occur the preliminary closure duration after the preliminary closing times of the respective switch and
- [F] wherein the difference between half of the first duration (T/2) and the preliminary closure duration defines a dead time which is preferably chosen in such a way that the voltages over all sections of the bridge circuits have essentially disappeared at the following preliminary closing time under nominal working conditions.

14. The method according to claim 12, wherein controlling the switching of the first and the second switch includes waiting a delay after a threshold crossing in the case of the comparison which is negative before closing the first or the second switch if a duration between the threshold crossing and the preliminary opening time of the respective switch is greater than the delay.

15. The method according to claim 12, wherein the measured value is the current and wherein the threshold is a current value between 0 and 10 ampere.

16. The method according to claim 12, wherein controlling the switching of the first and second switch comprises opening the first or the second switch if absolute value of the measured value is equal or exceeds a third threshold which is greater than the first threshold.

17. The method according to claim 12, wherein the bridge circuit comprises a second branch connected between the first and the second input terminal and including a first section between the first input terminal and a centre tap and including a second section between the centre tap and the second input terminal, where the first section includes a third switch and the second section includes a fourth switch wherein the method comprises the step of controlling a switching of the third and fourth switch of the second branch in dependency of a result of said comparison.

18. A controller for controlling a first and a second switch of a bridge circuit, where the bridge circuit comprises a first and a second input terminal for connecting a power source, a first branch connected between the first and the second input terminal and including a first section between the first input terminal and a centre tap and including a second section between the centre tap and the second input terminal, where the first section includes a first switch and the second section includes a second switch, characterized in that the controller comprises e) an input for receiving a measured value of a current or of a voltage in the bridge circuit provided by a measuring unit;
f) a comparison unit for comparing the measured value with the threshold, preferably for comparing the measured value with a first and a third threshold, and
g) drive means for controlling a switching of the first and the second switch of the first branch in dependency of a result of said comparison
h) wherein the comparison unit and the drive means are adapted to be able to execute the steps of the method according to claim 12.

19. A switch control arrangement for a converter, comprising the controller according to claim 18 and a measuring unit for measuring a current or a voltage in the bridge circuit.

20. A converter comprising the switch control arrangement according to claim 19 and the bridge circuit.

* * * * *